United States Patent
Uchimura

(10) Patent No.: US 12,211,558 B2
(45) Date of Patent: Jan. 28, 2025

(54) SEMICONDUCTOR STORAGE DEVICE

(71) Applicant: Kioxia Corporation, Tokyo (JP)

(72) Inventor: Yasuhiro Uchimura, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 69 days.

(21) Appl. No.: 18/177,730

(22) Filed: Mar. 2, 2023

(65) Prior Publication Data
US 2024/0062826 A1 Feb. 22, 2024

(30) Foreign Application Priority Data

Aug. 19, 2022 (JP) .................... 2022-131352

(51) Int. Cl.
| | |
|---|---|
| G11C 16/30 | (2006.01) |
| G11C 16/04 | (2006.01) |
| G11C 16/16 | (2006.01) |
| G11C 16/34 | (2006.01) |
| H10B 41/27 | (2023.01) |
| H10B 43/27 | (2023.01) |

(52) U.S. Cl.
CPC ......... *G11C 16/16* (2013.01); *G11C 16/0483* (2013.01); *G11C 16/3445* (2013.01); *H10B 41/27* (2023.02); *H10B 43/27* (2023.02)

(58) Field of Classification Search
CPC ......... G11C 16/30; G11C 16/28; G11C 16/04; G11C 16/26
See application file for complete search history.

(56) References Cited

U.S. PATENT DOCUMENTS

| | | |
|---|---|---|
| 7,319,615 B1 | 1/2008 | Park |
| 8,149,631 B2 | 4/2012 | Shiino |
| 8,953,371 B2 | 2/2015 | Shiino |
| 2012/0275226 A1* | 11/2012 | Nakamura ............ G11C 16/30 365/185.21 |

FOREIGN PATENT DOCUMENTS

| | | |
|---|---|---|
| JP | 5450013 B2 | 3/2014 |
| JP | 5450538 B2 | 3/2014 |

* cited by examiner

*Primary Examiner* — Jason Lappas
(74) *Attorney, Agent, or Firm* — Kim & Stewart LLP

(57) ABSTRACT

According to one embodiment, in a semiconductor storage device, during an erasing operation, a voltage supplied to at least one of a first wiring and a second wiring is set as a first voltage, and a voltage supplied to a first conductive layer is set as a second voltage. The erasing operation includes a first operation period in which the first voltage is increased from a first reference voltage to a first erase voltage and the second voltage is increased from a second reference voltage to a second erase voltage. In a second operation period of the erasing operation, the first voltage is maintained at the first erase voltage and the second voltage is decreased from the second erase voltage to the second reference voltage (or a first level voltage larger than the second reference voltage) after the first operation period.

18 Claims, 17 Drawing Sheets

SEMICONDUCTOR STORAGE DEVICE

CROSS-REFERENCE TO RELATED APPLICATION

This application is based upon and claims the benefit of priority from Japanese Patent Application No. 2022-131352, filed Aug. 19, 2022, the entire contents of which are incorporated herein by reference.

FIELD

Embodiments described herein relate generally to a semiconductor storage device.

BACKGROUND

There is a known semiconductor storage device that includes: a substrate; a plurality of first conductive layers arranged in a first direction intersecting a surface of the substrate; and a semiconductor layer extending in the first direction and facing the plurality of first conductive layers.

DETAILED DESCRIPTION

Figure 1:
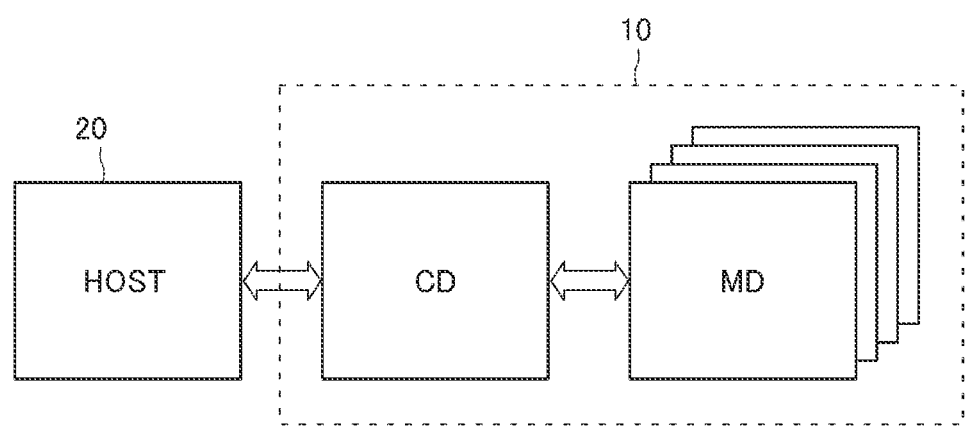
FIG. 1 is a schematic block diagram of a memory system.

In general, according to one embodiment, a semiconductor storage device has a plurality of conductive layers arranged (stacked) in a first direction. A first semiconductor pillar extends in the first direction through the plurality of conductive layers. A charge storage layer is between the first semiconductor pillar and the plurality of conductive layers. A first wiring is connected to a first end of the first semiconductor pillar. A second wiring is connected to a second end of the first semiconductor pillar. A control circuit that is electrically connected to the plurality of conductive layers, the first wiring, and the second wiring is configured to execute an erasing operation. The erasing operation includes a first operation period in which a first voltage supplied to at least one of the first wiring and the second wiring is increased from a first reference voltage level to a first erase voltage level and a second voltage supplied to a first conductive layer in the plurality of conductive layers is increased from a second reference voltage level to a second erase voltage level. In a second operation period of the erasing operation that is after the first operation period, the control circuit is configured to is maintained the first voltage at the first erase voltage level and the second voltage is decreased from the second erase voltage level to the second reference voltage level or a first level voltage, which is larger than the second reference voltage level.

Next, semiconductor storage devices according to certain example embodiments will be described with reference to the drawings. It is noted that the specifically described embodiments are merely examples and are not intended to limit the present disclosure.

In this specification, a "semiconductor storage device" may be a memory die (memory chip) or a memory system including a controller die such as a memory card, a solid-state drive (SSD), or the like. Furthermore, in some cases, a "semiconductor storage device" may include a host computer, such as a smart phone, a tablet terminal, or a personal computer.

In this specification, when it is said that the first component is "electrically connected" to the second component, the first component may be directly connected to the second component or the first component may be connected to the second component via wirings, semiconductor elements, transistors, or the like. For example, when three transistors are connected in series, even though the middle transistor is in the OFF state, the first transistor can still be considered "electrically connected" to the third transistor.

In this specification, when a first component is said to be "connected between" a second component and a third component, it may denote that the first component, the second component, and the third component are connected in series or may denote that the second component is connected to the third component through the first component.

In this specification, one direction parallel to the upper surface of a base substrate or the like is referred to as an X direction, another direction parallel to the upper surface of the substrate and perpendicular to the X direction is referred to as a Y direction. A direction orthogonal to the upper surface of the substrate is referred to as a Z direction.

In this specification, relative positional expressions such as "upper" and "lower" are referenced to the substrate. For example, a direction going away from the substrate along the Z direction is referred to as an upper or upward direction, and a direction going toward the substrate along the Z direction is referred to as a lower direction. In addition, when referring to a lower surface or a lower end of a certain components, these refer to the surface or the end of the configuration on the substrate-side of the component. When referring to an upper surface or an upper end, these refer to the surface or the end of the configuration farthest away or facing away from the substrate. In addition, a surface that intersects the X direction or the Y direction can be referred to as a side surface or the like.

In addition, in this specification, with respect to components, members, and the like, in some cases, the terms "width", "length", "thickness", or the like in a predetermined direction may denote the width, the length, the thickness, or the like in a cross-section or the like observed by Scanning electron microscopy (SEM), Transmission electron microscopy (TEM), or the like.

First Embodiment

Memory System 10

FIG. 1 is a schematic block diagram illustrating a configuration of a memory system 10.

The memory system 10 reads, writes, and erases user data according to signals transmitted from a host computer 20. The memory system 10 is, for example, a memory chip, a memory card, an SSD, or other system capable of storing the user data. The memory system 10 includes a plurality of memory dies MD for storing the user data and a controller die CD connected to the plurality of memory dies MD and the host computer 20. The controller die CD includes, for example, a processor, a RAM, a ROM, an ECC circuit, and the like and performs processes such as logical-to-physical address conversion, bit error detection/correction, and wear leveling.

Configuration of Memory Die MD

Figure 2:
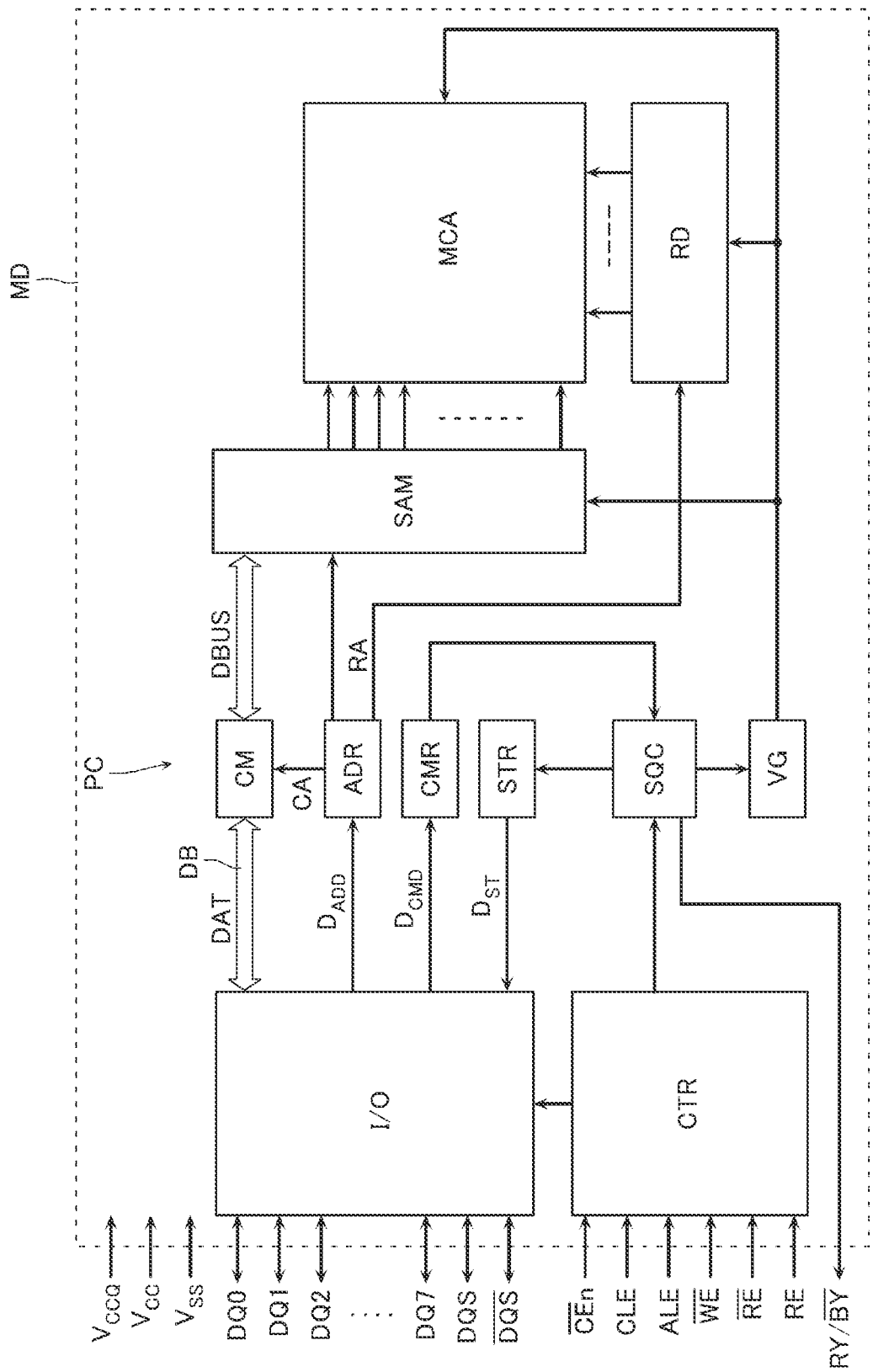
FIG. 2 is a schematic block diagram of a memory die.
Figure 3:
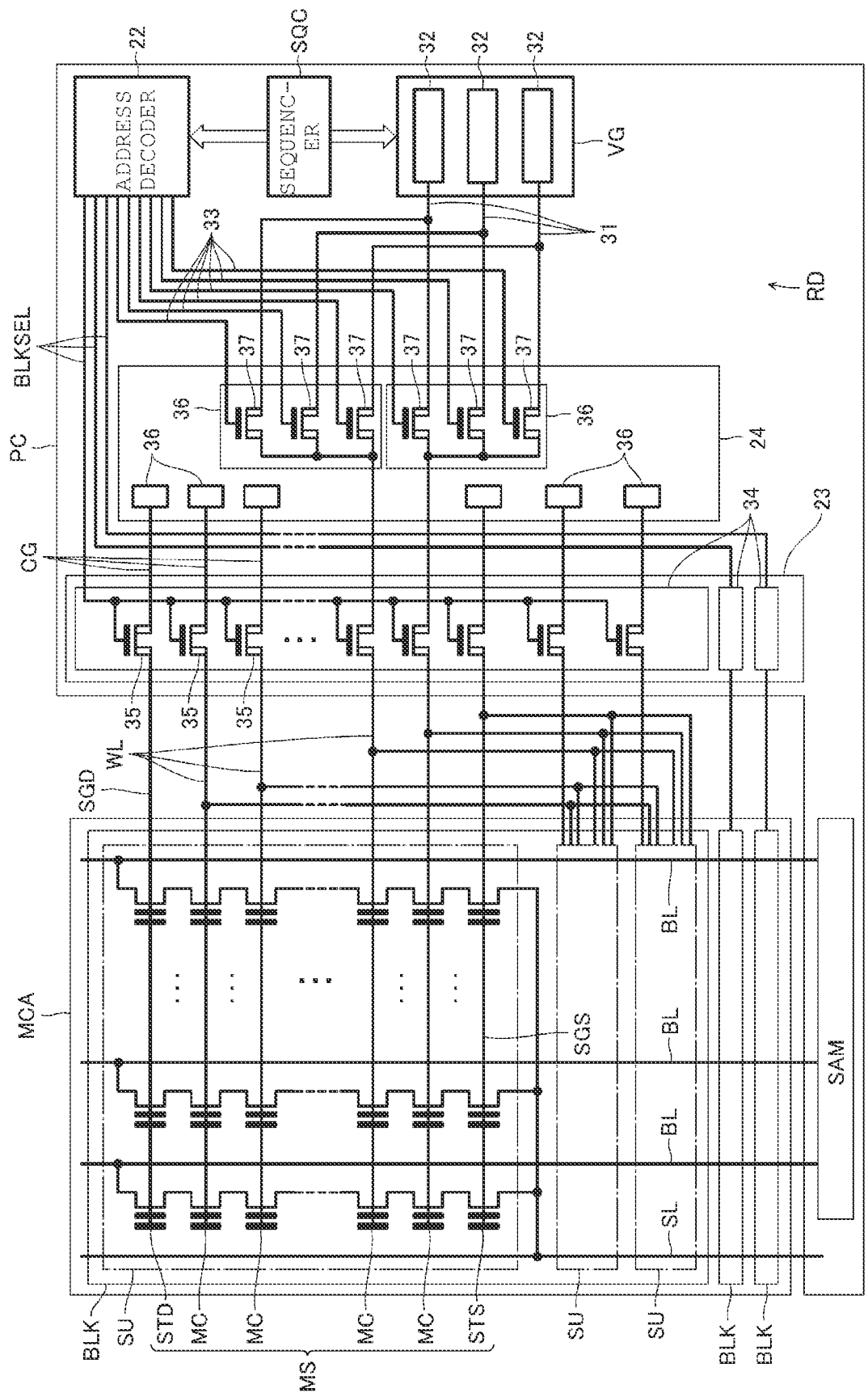
FIG. 3 is a schematic diagram of a portion of a memory die.
Figure 4:
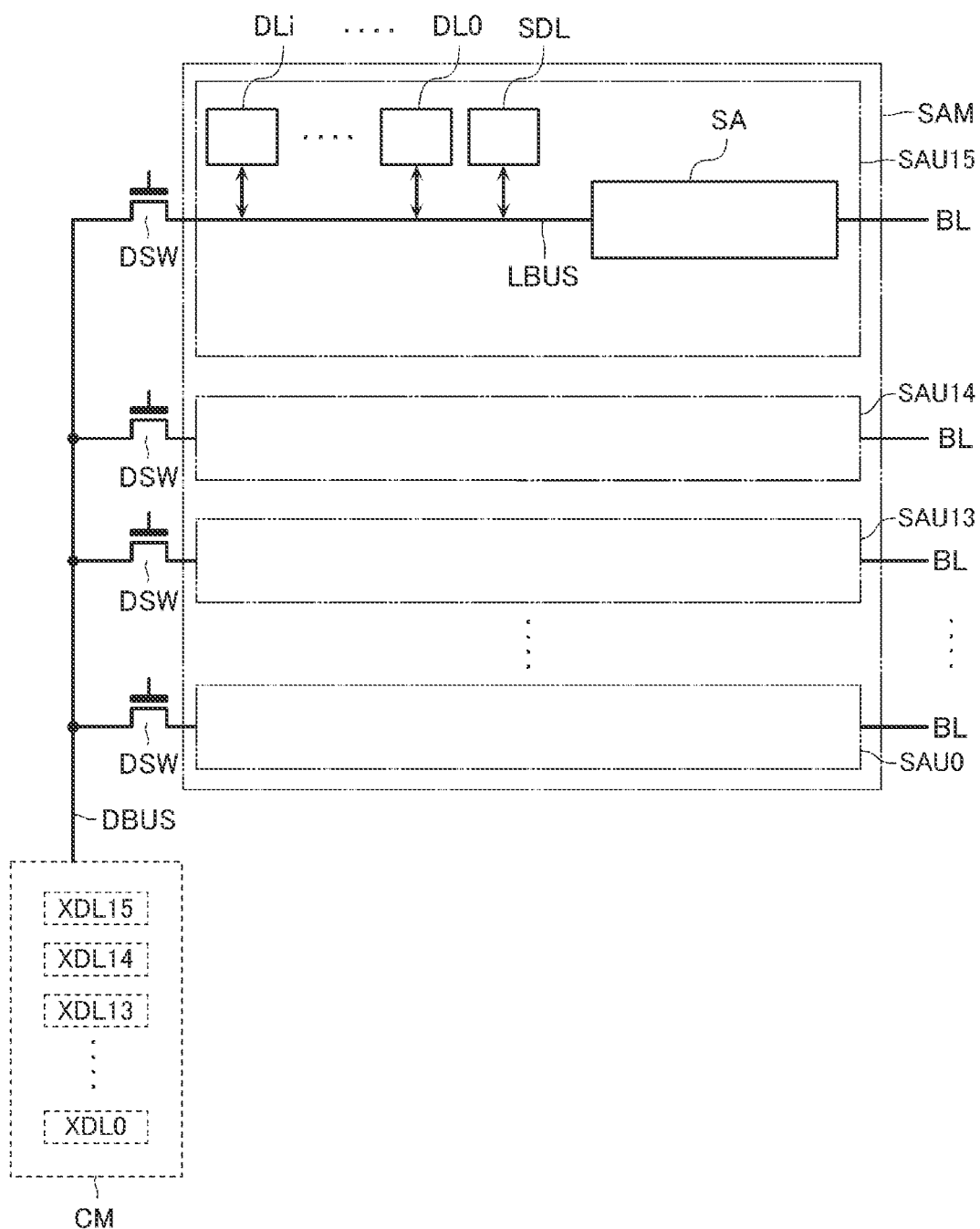
FIG. 4 is a schematic block diagram of a sense amplifier module.

FIG. 2 is a schematic block diagram illustrating a configuration of the memory die MD. FIG. 3 is a schematic diagram illustrating a configuration of a portion of the memory die MD. FIG. 4 is a schematic block diagram illustrating a configuration of a sense amplifier module SAM.

It is noted that FIG. 2 illustrates a plurality of control terminals and/or signal and the like. The plurality of control terminals may be represented as control terminals corresponding to high active signals (positive logic signals), represented as control terminals corresponding to low active signals (negative logic signals), or represented as control terminals corresponding to both the high active signals and the low active signal. In FIG. 2, symbols of the control terminals corresponding to the low active signals include over-lines (upper lines). In this specification, symbols of the control terminal corresponding to the low active signal include a slash ("/").

It is noted FIG. 2 is one example, and specific aspects may be adjusted as appropriate. For example, some or all of the high active signals can be set as low active signals, and some or all of the low active signals can be set as high active signals. In addition, a terminal RY/(/BY) can be a terminal for outputting a ready signal as a high active signal or a busy signal as a low active signal. The slash ("/") between RY and (/BY) in this context indicates a delimiter between the ready signal and the busy signal rather than a low active signal.

As illustrated in FIG. 2, the memory die MD includes a memory cell array MCA storing data and a peripheral circuit PC connected to the memory cell array MCA.

Circuit Configuration of Memory Cell Array MCA

As illustrated in FIG. 3, the memory cell array MCA includes a plurality of memory blocks BLK. Each of the plurality of memory blocks BLK includes a plurality of string units SU. Each of the plurality of string units SU includes a plurality of memory strings MS. One end of each of the memory strings MS is connected to the peripheral circuit PC via a bit line BL. The other end of each of the memory strings MS is connected to the peripheral circuit PC via a common source line SL.

The memory string MS includes a drain-side select transistor STD, a plurality of memory cells MC (memory cell transistors), and a source-side select transistor STS which are connected in series between the bit line BL and the source line SL. Hereinafter, the drain-side select transistor STD and the source-side select transistor STS may be simply referred to as select transistors (STD and STS).

The memory cell MC is a field effect transistor (memory transistor) including a semiconductor layer, a gate insulating film, and a gate electrode. The semiconductor layer functions as a channel region. The gate insulating film includes a charge storage film. A threshold voltage of the memory cell MC changes according to the amount of charge in the charge storage film. The memory cell MC normally stores 1-bit or multiple-bit data. It is noted that the word line WL is connected to each gate electrode of the plurality of memory cells MC corresponding to one memory string MS. These word lines WL are commonly connected to all memory strings MS in one memory block BLK.

A select transistor (STD, STS) is a field effect transistor including a semiconductor layer, a gate insulating film, and a gate electrode. The semiconductor layer functions as a channel region. A drain-side select gate line SGD and a source-side select gate line SGS are connected to the gate electrodes of the select transistors (STD and STS), respectively. The drain-side select gate line SGD is provided corresponding to the string unit SU and commonly connected to all memory strings MS in one string unit SU. The source-side select gate line SGS is commonly connected to all memory strings MS in the memory block BLK. The drain-side select gate line SGD and the source-side select gate line SGS may be simply referred to as select gate lines (SGD and SGS).

Circuit Configuration of Peripheral Circuit PC

The peripheral circuit PC, as illustrated in FIG. 2, includes a row decoder RD, a sense amplifier module SAM, a cache memory CM, a voltage generation circuit VG, and a sequencer SQC. The peripheral circuit PC also includes an address register ADR, a command register CMR, and a status register STR. The peripheral circuit PC also includes an input/output control circuit I/O and a logic circuit CTR.

Configuration of Row Decoder RD

As illustrated in FIG. 3, the row decoder RD (FIG. 2) includes an address decoder 22 decoding address data $D_{ADD}$ (FIG. 2). In addition, the row decoder RD (FIG. 2) includes a block selection circuit 23 and a voltage selection circuit 24 that transfer an operating voltage to the memory cell array MCA according to the output signal of the address decoder 22.

The address decoder 22 is connected to a plurality of block select lines BLKSEL and a plurality of voltage select lines 33. The address decoder 22 sequentially refers to the row addresses RA in the address register ADR (FIG. 2) according to, for example, a control signal from the sequencer SQC.

The block selection circuit 23 includes a plurality of block selection circuits 34 corresponding to the memory blocks BLK. Each block selection circuit 34 includes a plurality of block select transistors 35 corresponding to the word lines WL and the select gate lines (SGD and SGS).

A block select transistor 35 is, for example, a field-effect breakdown voltage transistor. The drain electrodes of the block select transistors 35 are electrically connected to the corresponding word lines WL or select gate lines (SGD and SGS), respectively. The source electrodes of the block select transistors 35 are electrically connected to voltage supply lines 31 via wirings CG and the voltage selection circuits 24, respectively. The gate electrodes of the block select transistors 35 are commonly connected to the corresponding block select lines BLKSEL.

The voltage selection circuit 24 includes a plurality of voltage selection units 36 corresponding to the word lines WL and the select gate lines (SGD and SGS). Each of the voltage selection units 36 includes a plurality of voltage select transistors 37. A voltage select transistor 37 is, for example, a field-effect breakdown voltage transistor. The drain terminals of the voltage select transistors 37 are electrically connected to the corresponding word lines WL or select gate lines (SGD and SGS) via the wirings CG and the block selection circuits 23. The source terminals are electrically connected to the corresponding voltage supply lines 31. The gate electrodes are connected to the corresponding voltage selection lines 33.

Configuration of Sense Amplifier Module SAM and Cache Memory CM

The sense amplifier module SAM, as illustrated in FIG. 4, includes sense amplifier units SAU0 to SAU15 corresponding to the plurality of bit lines BL (for example, 16 bit lines BL). Each of the sense amplifier units SAU0 to SAU15 includes a sense amplifier SA connected to a bit line BL, a wiring LBUS connected to the sense amplifier SA, latch circuit SDL connected to the wiring LBUS, and latch circuits DL0 to DLi connected to the wiring LBUS, where i is an integer of 1 or more.

The sense amplifier SA senses data read from the memory cell MC. The latch circuits (SDL and DL0 to DLi) temporarily store the data sensed by the sense amplifier SA. The wiring LBUS is connected to a wiring DBUS through a switch transistor DSW.

As illustrated in FIG. 4, the cache memory CM (data register) is connected to the wiring DBUS. The cache memory CM includes latch circuits XDL0 to XDL15 corresponding to the sense amplifier units SAU0 to SAU15. The data to be written to the memory cells MC or the data read from the memory cells MC are stored in the latch circuits XDL0 to XDL15.

It is noted that the data DAT (see FIG. 2) in the latch circuits XDL0 to XDL15 can be sequentially transferred to the latch circuits (for example, latch circuits SDL) in the sense amplifier module SAM during the write operation. In addition, the data provided in the latch circuits SDL, and DL0 to DLi in the sense amplifier module SAM can be sequentially transferred to the latch circuits XDL0 to XDL15 during the read operation. In addition, the data DAT provided in the latch circuits XDL0 to XDL15 can be sequentially transferred to the input/output control circuit I/O during the data-out operation.

Configuration of Voltage Generation Circuit VG

As illustrated in FIG. 3, the voltage generation circuit VG (FIG. 2) is connected to voltage supply lines 31. The voltage generation circuit VG includes, for example, a step-down circuit (such as a regulator) and a step-up circuit (such as a charge pump circuit 32). The step-down circuit and the step-up circuit are connected to voltage supply lines to which a power supply voltage $V_{CC}$ and a ground voltage $V_{SS}$ (FIG. 2) are supplied, respectively. The voltage generation circuit VG generates a plurality of operating voltages to be applied to the bit lines BL, the source lines SL, the word lines WL, and the select gate lines (SGD and SGS) according to the control signal from the sequencer SQC during the read operation, the write operation, and the erasing operations for the memory cell array MCA and simultaneously outputs the operating voltages to the plurality of voltage supply lines 31. The operating voltage output from the voltage supply line 31 can be appropriately adjusted according to the control signal from the sequencer SQC.

Configuration of Sequencer SQC

The sequencer SQC (FIG. 2) outputs an internal control signal to the row decoder RD, the sense amplifier module SAM, and the voltage generation circuit VG according to a command data $D_{CMD}$ stored in the command register CMR. In addition, the sequencer SQC outputs a status data $D_{ST}$ indicating the status of the memory die MD to the status register STR as appropriate.

The sequencer SQC also generates a ready/busy signal and outputs the ready/busy signal to the terminal RY/(/BY). During the period (busy period) in which the terminal RY/(/BY) is in the "L" state, the access to the memory die MD is basically prohibited. During the period (ready period) in which the terminal RY/(/BY) is in the "H" state, the access to the memory die MD is permitted.

Configuration of Address Register ADR

As illustrated in FIG. 2, the address register ADR is connected to the input/output control circuit I/O and stores the address data $D_{ADD}$ input from the input/output control circuit I/O. The address register ADR has, for example, a plurality of 8-bit register columns. For example, when an internal operation such as a read operation, a write operation, or an erasing operation is executed, the register column holds the address data $D_{ADD}$ corresponding to the internal operation being executed.

It is noted that the address data $D_{ADD}$ includes, for example, a column address CA (FIG. 2) and a row address RA (FIG. 2). The row address RA includes, for example, a block address specifying a memory block BLK (FIG. 3), a page address specifying a string unit SU and a word line WL, a plane address specifying a memory cell array MCA (plane), and a chip address specifying a memory die MD.

Configuration of Command Register CMR

The command register CMR is connected to the input/output control circuit I/O and stores the command data $D_{CMD}$ input from the input/output control circuit I/O. The command register CMR has at least one set of, for example, 8-bit register columns. After the command data $D_{CMD}$ is stored in the command register CMR, the control signal is transmitted to the sequencer SQC.

Configuration of Status Register STR

The status register STR is connected to the input/output control circuit I/O and stores the status data $D_{ST}$ to be output to the input/output control circuit I/O. The status register STR has, for example, a plurality of 8-bit register columns. For example, when the internal operation such as the read operation, the write operation, or the erasing operation is executed, the register column holds the status data $D_{ST}$ corresponding to the internal operation being executed. In addition, the register column holds, for example, the ready/busy information of the memory cell array MCA.

Configuration of Input/Output Control Circuit I/O

The input/output control circuit I/O (FIG. 2) includes data signal input/output terminals DQ0 to DQ7, data strobe signal input/output terminals DQS and /DQS, a shift register, and a buffer circuit.

The data input via the data signal input/output terminals DQ0 to DQ7 are input from the buffer circuit to the cache memory CM, the address register ADR, or the command register CMR according to the internal control signal from the logic circuit CTR. In addition, the data output via the data signal input/output terminals DQ0 to DQ7 are input to the buffer circuit from the cache memory CM or the status register STR according to the internal control signal from the logic circuit CTR.

The signals (for example, data strobe signals and complementary signals thereof) input via the data strobe signal input/output terminals DQS and /DQS are used for data input via the data signal input/output terminals DQ0 to DQ7. The data input via the data signal input/output terminals DQ0 to DQ7 are received into a shift register in the input/output control circuit I/O at the timing of the rising edge (switching of input signal) of the voltage of the data strobe signal input/output terminal DQS and the falling edge (switching of input signal) of the voltage of the data strobe signal input/output terminal /DQS and the timing of the falling edge (switching of input signal) of the voltage of the data strobe signal input/output terminal DQS and the rising edge (switching of input signal) of the voltage of the data strobe signal input/output terminal /DQS.

Configuration of Logic Circuit CTR

The logic circuit CTR (FIG. 2) includes a plurality of external control terminals /CE, CLE, ALE, /WE, /RE, and RE and a logic circuit connected to the plurality of external control terminals /CE, CLE, ALE, /WE, /RE, and RE. The logic circuit CTR receives external control signals from the controller die CD via the external control terminals /CE, CLE, ALE, /WE, /RE, the RE, and outputs internal control signals to the input/output control circuit I/O according to the external control signals.

Structure of Memory Die MD

Figure 5:
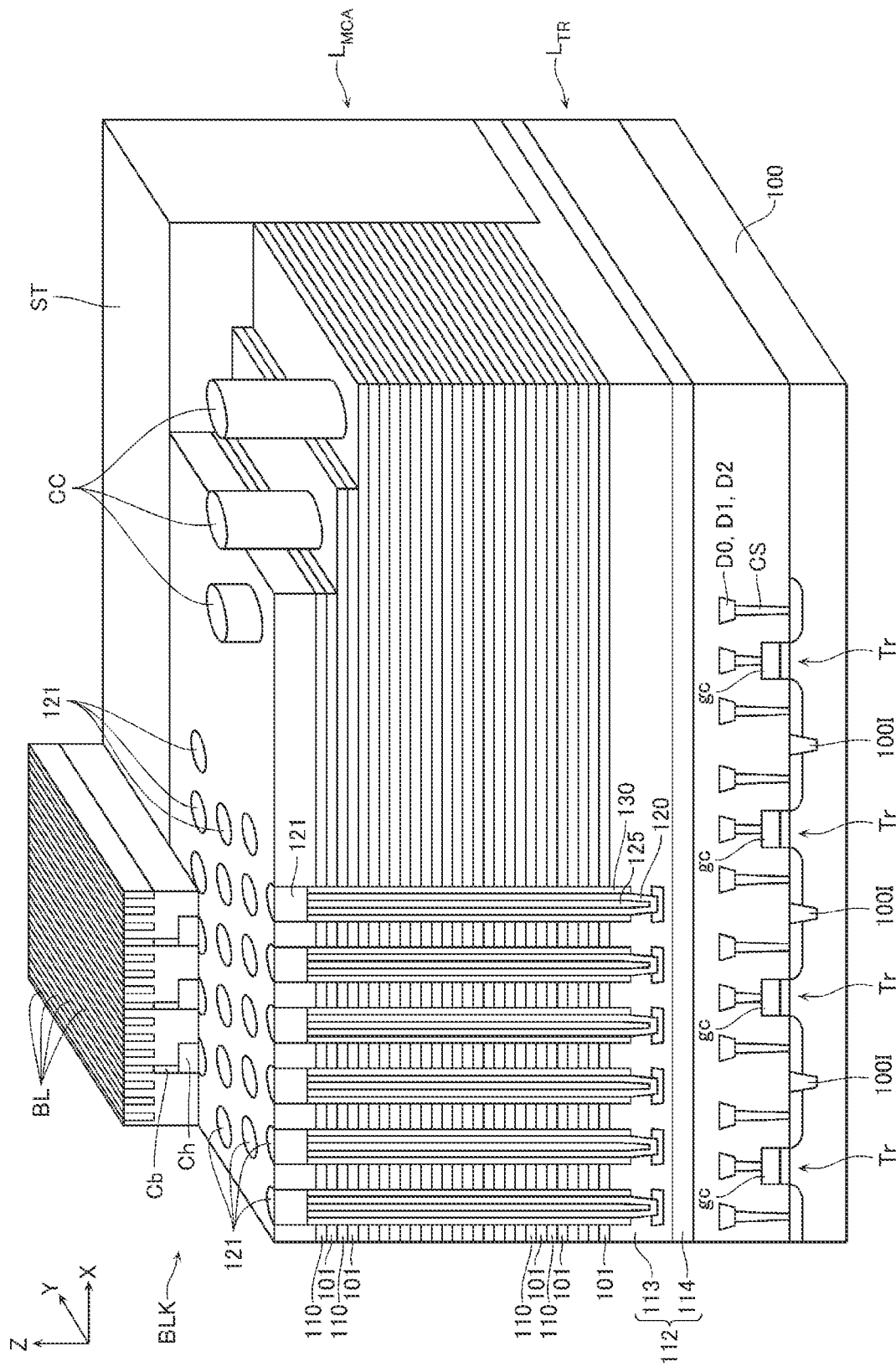
FIG. 5 is a schematic perspective view of a portion of a memory die.
Figure 6:
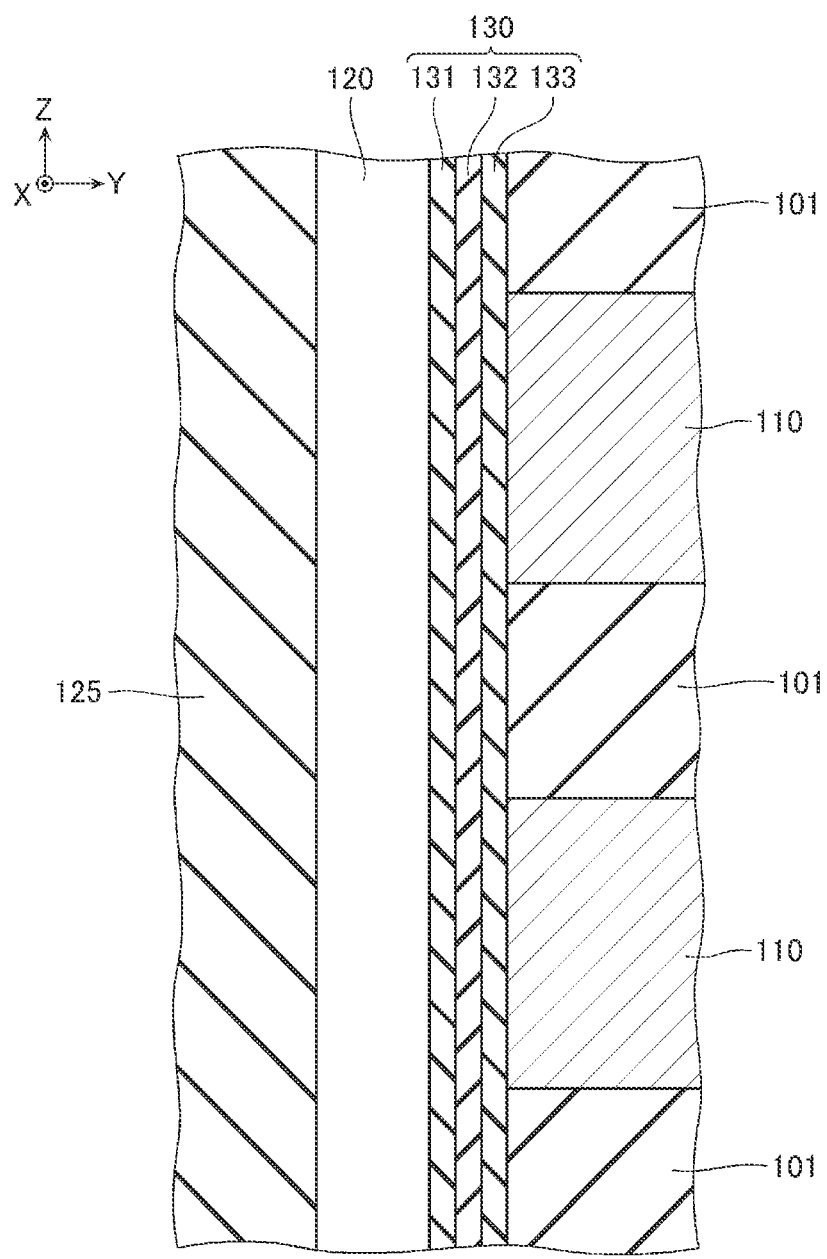
FIG. 6 is an enlarged view of a portion of a memory die.

FIG. 5 is a schematic perspective view illustrating a configuration of a portion of a memory die MD. FIG. 6 is a schematic enlarged view illustrating a configuration of a portion of FIG. 5. It is noted that FIGS. 5 and 6 illustrate schematic configurations, and specific configurations may be changed as appropriate.

As illustrated in FIG. 5, the memory die MD includes a semiconductor substrate 100, a transistor layer $L_{TR}$ provided on the semiconductor substrate 100, and a memory cell array layer $L_{MCA}$ provided above the transistor layer $L_{TR}$.

Structure of Semiconductor Substrate 100

The semiconductor substrate 100 is a semiconductor substrate of, for example, single crystal silicon (Si) containing P-type impurities or the like. An N-type well containing N-type impurities such as phosphorus (P) is provided on a portion of the surface of the semiconductor substrate 100. A P-type well containing P-type impurities such as boron (B) is provided on a portion of the surface of the N-type well. An insulating region 100I is provided on a portion of the surface of the semiconductor substrate 100.

Structure of Transistor Layer $L_{TR}$

A plurality of transistors Tr configuring the peripheral circuit PC are provided in the transistor layer $L_{TR}$. A source region, a drain region, and a channel region of each transistor Tr are provided on the surface of the semiconductor substrate 100. A gate electrode gc of each transistor Tr is provided in the transistor layer $L_{TR}$. Contacts CS are provided for the source region, the drain region, and the gate electrode gc for the plurality of transistors Tr. The contacts CS can be connected to other transistors Tr, components in the memory cell array layers $L_{MCA}$, and the like via wirings D0, D1, and D2 in the transistor layer $L_{TR}$.

Structure of Memory Cell Array Layer $L_{MCA}$

The memory cell array layer $L_{MCA}$ includes a plurality of memory blocks BLK and a plurality of inter-block structures ST alternately arranged in the Y direction. The memory block BLK includes: a plurality of conductive layers 110 and a plurality of insulating layers 101 alternately arranged in the Z direction; a plurality of semiconductor pillars 120 extending in the Z direction; and a plurality of gate insulating films 130 provided respectively between the plurality of conductive layers 110 and the plurality of semiconductor pillars 120.

The conductive layer 110 is a substantially plate-shaped conductive layer extending in the X direction and a plurality of the conductive layers are arranged in the Z direction. The conductive layer 110 may be, for example, a stacked film or the like of titanium nitride (TiN) and tungsten (W) or may comprise polycrystalline silicon doped with impurities such as phosphorus or boron.

Among the plurality of conductive layers 110, one or more of the conductive layers 110 located at the lowest layer(s) function as the source-side select gate line(s) SGS (FIG. 3) and the gate electrode(s) of the source-side select transistor(s) STS connected thereto. Moreover, the conductive layers 110 located above the lowest layer(s) function as the word lines WL (FIG. 3) and the gate electrodes of the plurality of memory cells MC (FIG. 3) connected thereto. In addition, one or more of the conductive layers 110 located above the conductive layers 110 functioning as the word lines WL serve as the drain-side select gate line(s) SGD and the gate electrode(s) of the drain-side select transistor(s) STD (FIG. 3) connected thereto.

A conductive layer 112 is provided below the lowest one of the conductive layers 110. The conductive layer 112 includes a semiconductor layer 113 connected to the lower end of the semiconductor pillar 120 and a conductive layer 114 connected to the lower surface of the semiconductor layer 113. The semiconductor layer 113 may comprise, for example, polycrystalline silicon or the like containing impurities such as phosphorus (P) or boron (B). The conductive layer 114 may comprise, for example, a conductive layer of a metal such as tungsten (W), a conductive layer of tungsten silicide or the like, or other conductive materials. An insulating layer 101 of silicon oxide ($SiO_2$) or the like is provided between the conductive layer 112 and the lowest one of the conductive layers 110.

The conductive layer 112 functions as the source line SL (FIG. 3). The source line SL is, for example, commonly provided for all memory blocks BLK in the memory cell array MCA (FIG. 3).

The semiconductor pillars 120 are arranged in the X direction and the Y direction. The semiconductor pillar 120 is, for example, a semiconductor film of undoped polycrystalline silicon (Si) or the like. The semiconductor pillar 120 has a substantially cylindrical shape, and the insulating film 125 of silicon oxide or the like is provided at the central portion. In addition, portions of each of the outer peripheral surfaces of the semiconductor pillars 120 are surrounded by the conductive layers 110. A lower end of the semiconductor pillar 120 is connected to the semiconductor layer 113 of the conductive layer 112. An upper end of the semiconductor pillar 120 is connected to the bit line BL via an impurity region 121 containing N-type impurities such as phosphorus (P) and the contacts Ch and Cb. Each of the semiconductor pillars 120 functions as channel regions of the plurality of memory cells MC and the select transistors STD and STS provided in one memory string MS (FIG. 3).

As illustrated in FIG. 6, the gate insulating film 130 includes, for example, a tunnel insulating film 131, a charge storage film 132, and a block insulating film 133 stacked between the semiconductor pillar 120 and the conductive layer 110. The tunnel insulating film 131 and the block insulating film 133 are, for example, insulating films of silicon oxide or the like. The charge storage film 132 is, for example, a film capable of storing charges such as silicon nitride (SiN) or the like. The tunnel insulating film 131, the charge storage film 132, and the block insulating film 133 have a substantially cylindrical shape and extend in the Z direction along the outer peripheral surface of the semiconductor pillar 120.

It is noted that FIG. 6 illustrates an example in which the gate insulating film 130 includes the charge storage film 132 (of silicon nitride or the like), but the gate insulating film 130 may be of a floating gate type of, for example, polycrystalline silicon or the like containing N-type or P-type impurities.

As illustrated in FIG. 5, the inter-block structures ST extend, for example, in the X and Z directions. The inter-block structure ST may include, for example, an insulating layer of silicon oxide ($SiO_2$) or the like. The inter-block structure ST may also include, for example, a conductive layer (e.g., a source line contact) extending in the X direction and the Z direction and connected to the conductive layer 112, and insulating layers of silicon oxide ($SiO_2$) or the like provided on both sides of the conductive layer in the Y direction.

Threshold Voltage of Memory Cell MC Recording Multiple Bits

Next, a threshold voltage of a memory cell MC recording data of multiple bits will be described with reference to FIGS. 7A, 7B, and 7C. As an example, the threshold voltage of a memory cell MC for recording 3-bit data is described.

Figure 7:
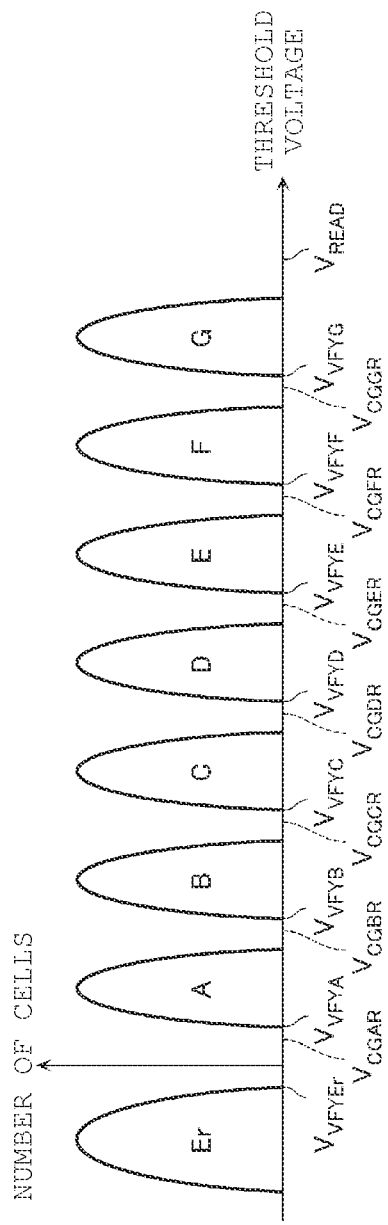
FIGS. 7A, 7B, and 7C provide a schematic histogram illustrating a threshold voltage of a memory cell in which 3-bit data is recorded in two different coding schemes.

FIG. 7A is a schematic histogram illustrating the threshold voltages of the memory cells MC by which the 3-bit data can be recorded. The horizontal axis indicates the voltage of the word line WL, and the vertical axis indicates the number of memory cells MC at the corresponding voltage. FIG. 7B is a table illustrating an example coding relationship between the threshold voltages of the memory cells MC in which the 3-bit data is recorded and the recorded data. FIG. 7C is a table illustrating another example of a coding relationship between the threshold voltages of the memory cells MC in which the 3-bit data is recorded and the recorded data.

In the example of FIG. 7A, the threshold voltages of the memory cells MC are controlled to be in one of eight different states. The threshold voltage of the memory cell MC controlled to an Er-state is lower than an erase verify voltage $V_{VFYEr}$. The threshold voltage of the memory cell MC controlled to an A-state is higher than a verify voltage $V_{VFYA}$ but lower than a verify voltage $V_{VFYB}$. The threshold voltage of the memory cell MC controlled to a B-state is higher than the verify voltage $V_{VFYB}$ but lower than a verify voltage $V_{VFYC}$. Similarly, the threshold voltages of the memory cells MC controlled to a C-state to an F-state are higher than the verify voltages $V_{VFYC}$ to $V_{VFYF}$ but lower than verify voltages $V_{VFYD}$ to $V_{VFYG}$, respectively. The threshold voltage of the memory cell MC controlled to a G-state is higher than the verify voltage $V_{VFYG}$ but lower than a read pass voltage $V_{READ}$. The read pass voltage $V_{READ}$ is, for example, a voltage of about 9 V.

In the example of FIG. 7A, a read voltage $V_{CGAR}$ is set to be between the threshold voltage distribution corresponding to the Er-state and the threshold voltage distribution corresponding to the A-state. A read voltage $V_{CGBR}$ is set to be between the threshold voltage distribution corresponding to the A-state and the threshold voltage distribution corresponding to the B-state. Similarly, read voltages $V_{CGCR}$ to $V_{CGGR}$ are set respectively to be between the threshold voltage distribution for each of the adjacent states.

For example, the Er-state corresponds to the lowest threshold voltage. The memory cell MC in the Er-state is, for example, a memory cell MC in the erased state. For example, the data "111" is assigned to the memory cell MC in the Er-state.

The A-state corresponds to a threshold voltage higher than the threshold voltage corresponding to the Er-state. For example, the data "101" is assigned to the memory cell MC in the A-state.

The B-state corresponds to a threshold voltage higher than the threshold voltage corresponding to the A-state. For example, the data "001" is assigned to the memory cell MC in the B-state.

Similarly, C-state to G-state correspond to the threshold voltages higher than the threshold voltages corresponding to the B-state to the F-state. For example, the data "011", "010", "110", "100", and "000" are respectively assigned to the memory cells MC in these other states.

It is noted that, in the case of the allocation as illustrated in FIG. 7B, lower bit data can be identified from one read voltage $V_{CGDR}$, and middle bit data can be identified from the three read voltages $V_{CGAR}$, $V_{CGCR}$, and $V_{CGFR}$, and upper bit data can be identified from the three read voltages $V_{CGBR}$, $V_{CGER}$, and $V_{CGGR}$. Such a data allocation scheme can be referred to as a 1-3-3 code.

It is noted that the number of bits of data to be recorded in the memory cell MC, the number of states, allocation of data to each state, and the like may be changed as appropriate.

In the case of the allocation as illustrated in FIG. 7C, lower bit data can be identified from one read voltage $V_{CGDR}$, middle bit data can be identified from two read voltages $V_{CGBR}$ and $V_{CGFR}$, and upper bit data can be identified from the four read voltages $V_{CGAR}$, $V_{CGCR}$, $V_{CGER}$, and $V_{CGGR}$. Such a data allocation scheme can be referred to as a 1-2-4 code.

Erasing Operation

Next, an erasing operation of the semiconductor storage device according to the first embodiment will be described.

Figure 8:
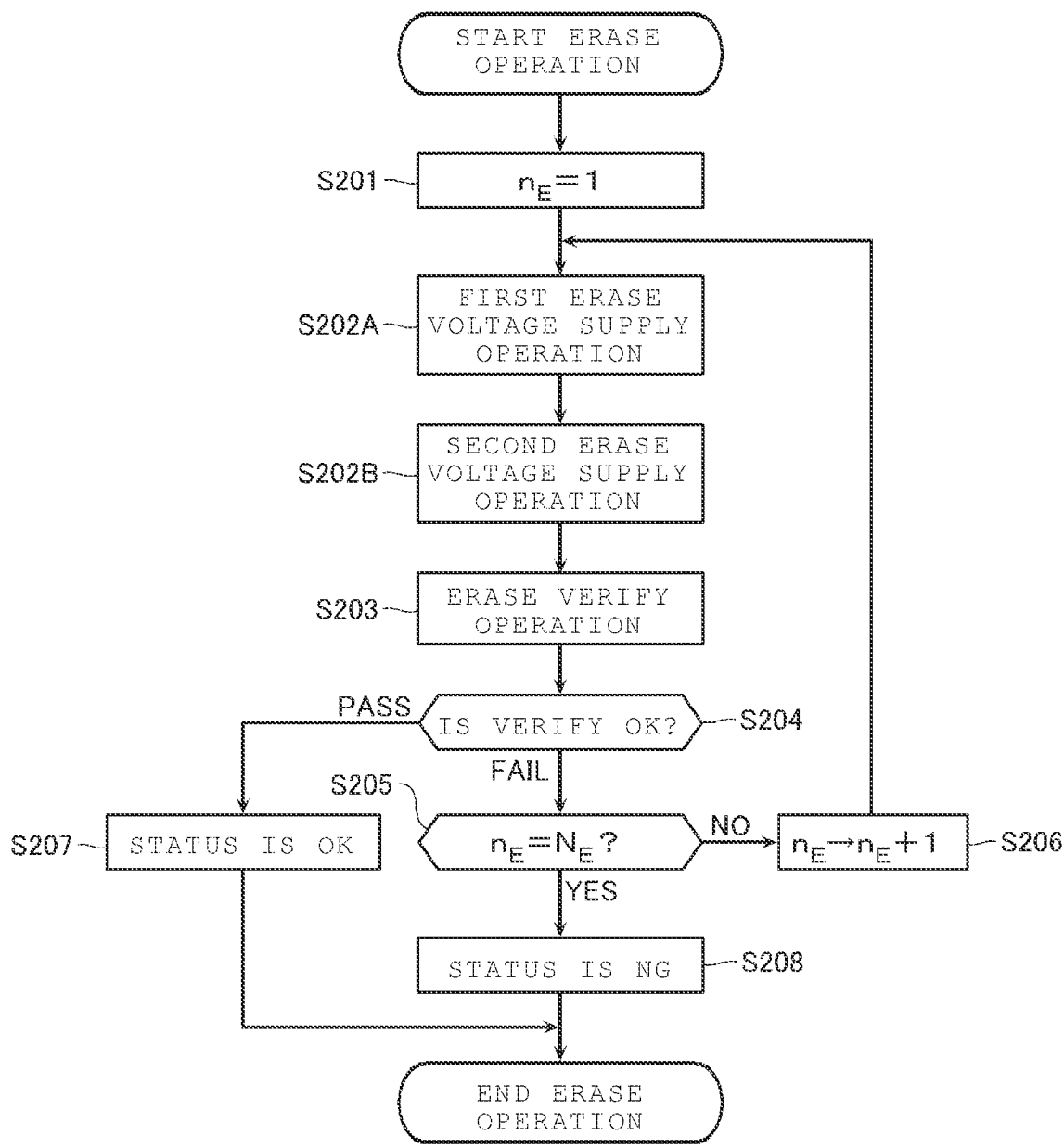
FIG. 8 is a flowchart of an erasing operation of a first embodiment.
Figure 9:
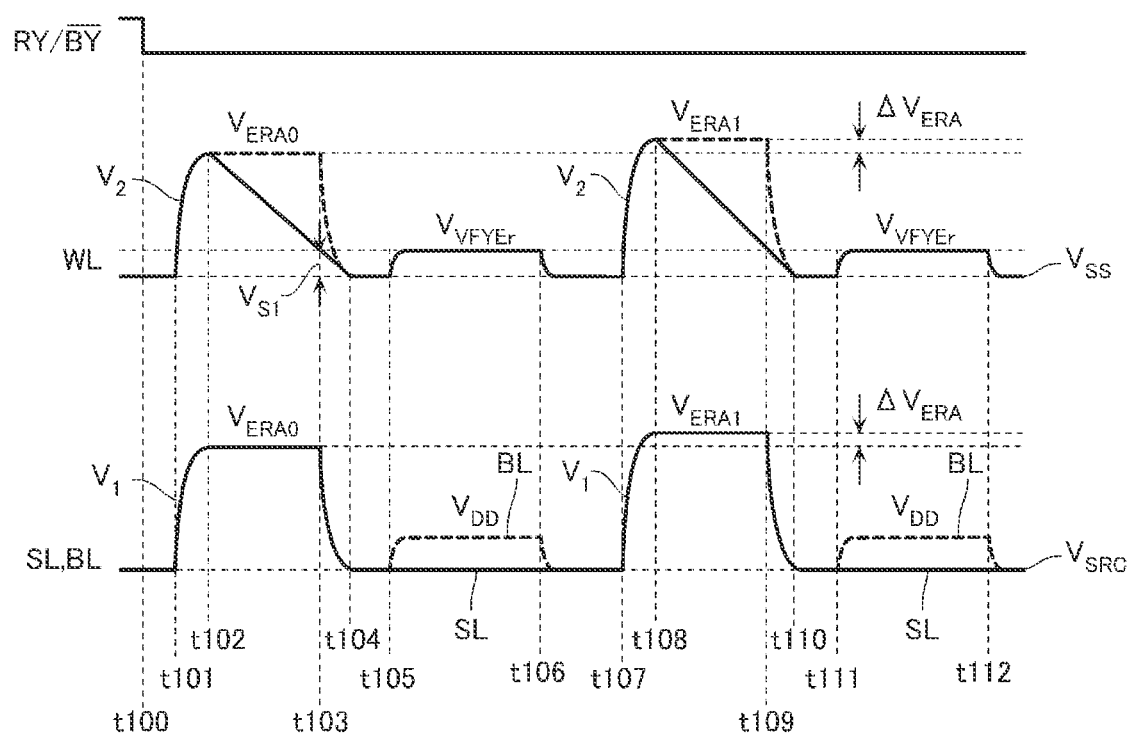
FIG. 9 is a timing chart illustrating aspects of an erasing operation of a first embodiment.
Figure 10:
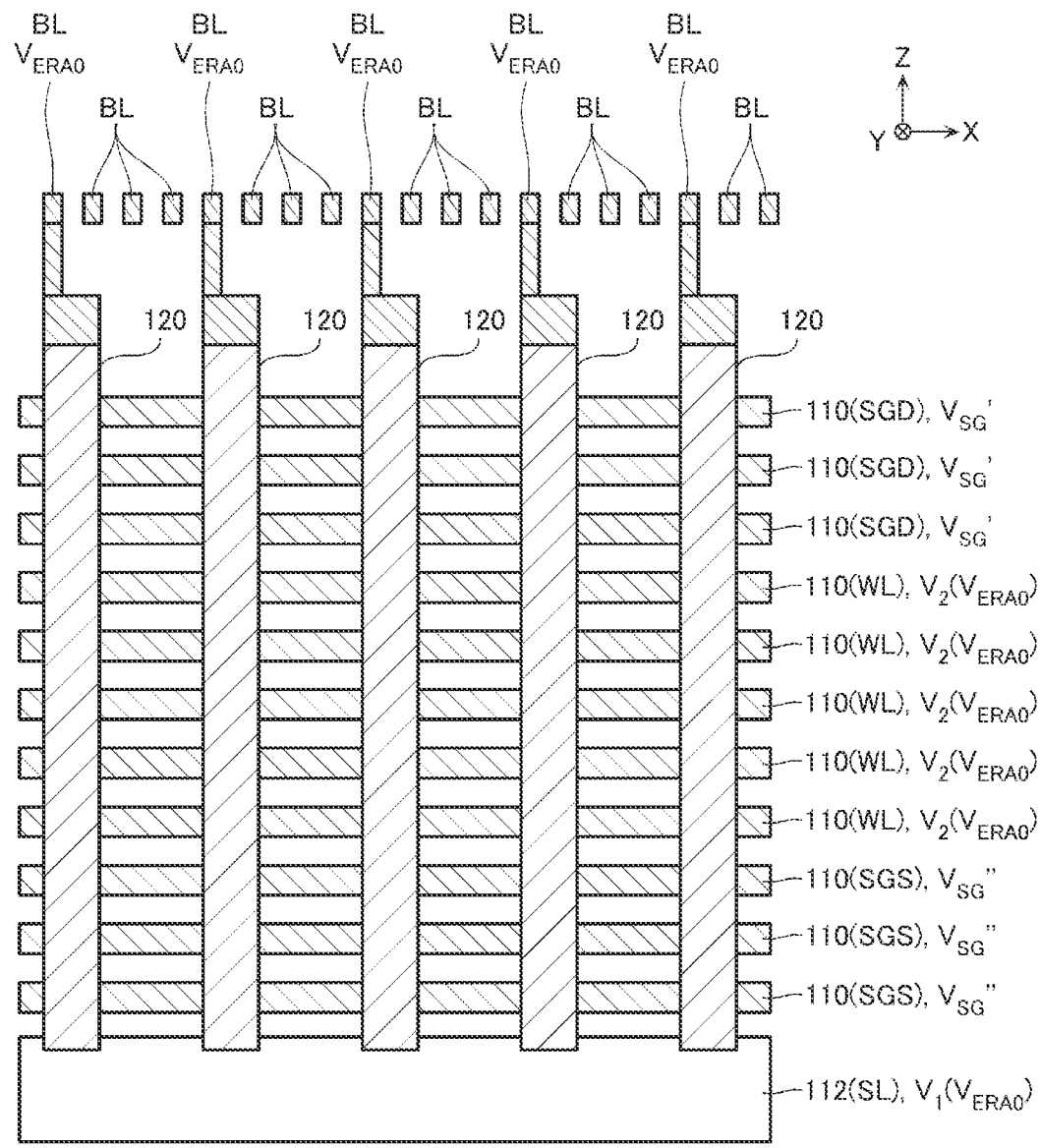
FIG. 10 is a schematic cross-sectional view illustrating a first erase voltage supply operation of a first embodiment.
Figure 11:
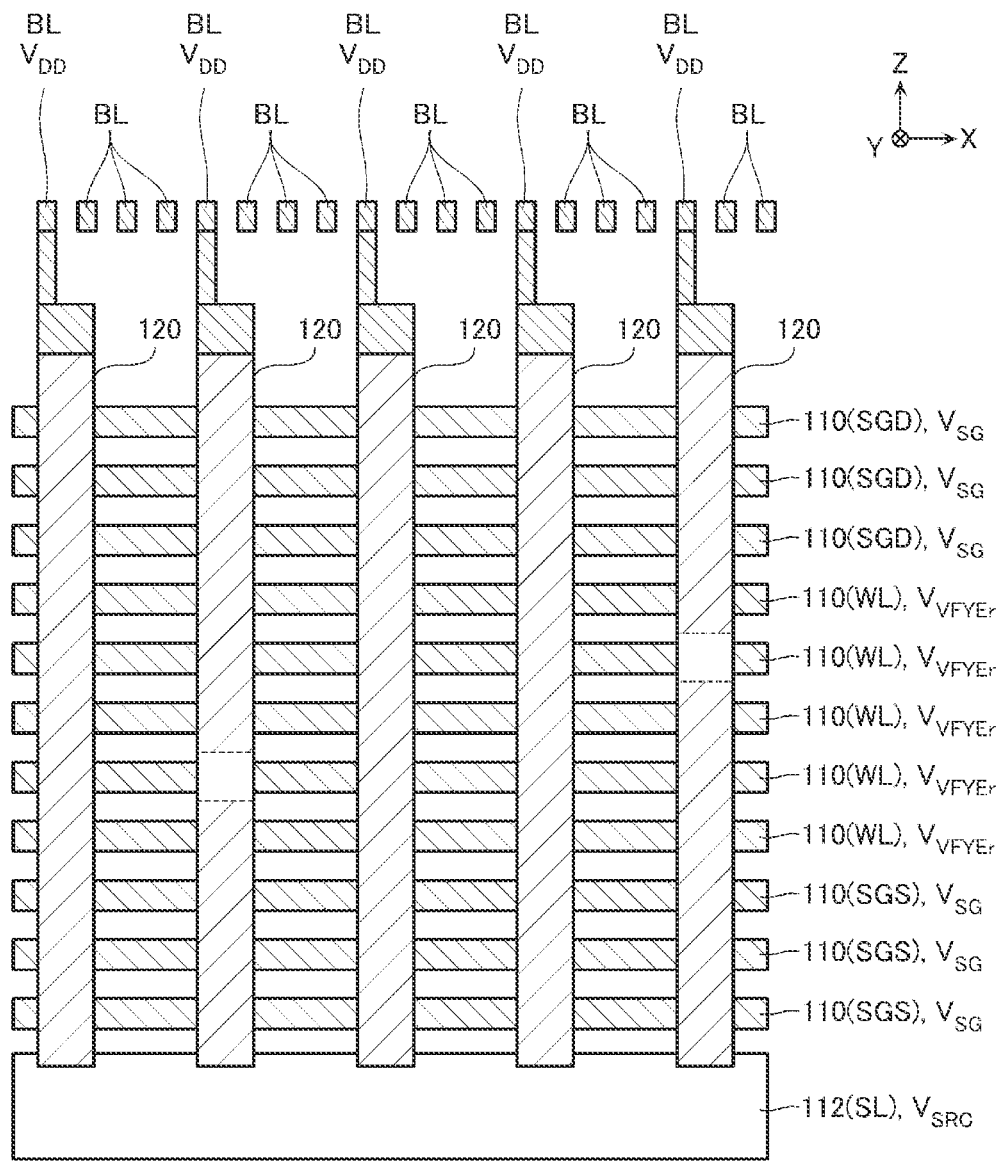
FIG. 11 is a schematic cross-sectional view illustrating an erase verify operation.

FIG. 8 is a flow chart illustrating the erasing operation of the first embodiment. FIG. 9 is a timing chart illustrating an erasing operation of the first embodiment. FIG. 10 is a schematic cross-sectional view illustrating the first erase voltage supply operation of the first embodiment. FIG. 11 is a schematic cross-sectional view illustrating aspects of an erase verify operation. FIG. 10 illustrates the voltages supplied to the bit lines BL, the source lines SL, the word lines WL, and the like at the timing t101 in FIG. 9. FIG. 11 illustrates the voltages supplied to the bit lines BL, the source lines SL, the word lines WL, and the like at the timings t105 to t106 in FIG. 9.

It is noted that, in the following description, an example of executing the erasing operation on an entire memory block BLK that is a target of the operation will be described.

In step S201, as illustrated in FIG. 8, the number $n_E$ (loop variable) is set to 1. The number $n_E$ is a variable indicating the number of times an erase attempt (the erasure loop) has been performed during the erase operation. This operation is executed, for example, at the timing t100 in FIG. 9. The RY/(/BY) signal may be in the "L" state, and access to the chip may be prohibited.

In step S202A, the first erase voltage supply operation is executed. The first erase voltage supply operation increases the first voltage $V_1$ supplied to the bit line BL and the source line SL from the first reference voltage level (voltage $V_{SRC}$ in FIG. 9) to the first erase voltage level ($V_{ERA0}$ or $V_{ERA1}$) and increases the second voltage $V_2$ supplied to the word line WL from the second reference voltage level (ground voltage $V_{SS}$ in FIG. 9) to the second erase voltage level ($V_{ERA0}$ or $V_{ERA1}$). In the example of FIG. 9, the first erase voltage supply operation is executed in a period from the timing t101 to the timing t102 and also a period from the timing t107 to the timing t108.

In FIG. 9, the first reference voltage level of the bit line BL and the source line SL is set as voltage $V_{SRC}$. However, in other examples, the first reference voltage level of the source line SL may be set as the voltage $V_{SRC}$, but the first reference voltage level of the bit line BL may be set as a voltage (for example, ground voltage $V_{SS}$) different from voltage $V_{SRC}$. The voltage $V_{SRC}$ may be higher than the ground voltage $V_{SS}$ (0 V) or may be equal to the ground voltage $V_{SS}$.

In the first erase voltage supply operation, as illustrated in FIGS. 9 and 10, the first voltage $V_1$ supplied to the bit line BL and the source line SL is increased from the first reference voltage level (ground voltage $V_{SRC}$) to the first erase voltage level ($V_{ERA0}$ or $V_{ERA1}$). The first erase voltage level ($V_{ERA0}$ or $V_{ERA1}$) is, for example, about 17 V to 25 V.

In the first erase voltage supply operation, as illustrated in FIG. 10, a voltage $V_{SG}'$ is supplied to the drain-side select gate line(s) SGD. The voltage $V_{SG}'$ is less than the first erase voltage level ($V_{ERA0}$ or $V_{ERA1}$). Accordingly, GIDL (Gate Induced Drain Leakage) occurs in the drain-side select transistor(s) STD, and electron-hole pairs are generated. In addition, the electrons move toward the bit line BL, and the holes move toward the memory cell MC.

In the first erase voltage supply operation, as illustrated in FIG. 10, a voltage $V_{SG}''$ is supplied to the source-side select gate line(s) SGS. The voltage $V_{SG}''$ is smaller than the first erase voltage level ($V_{ERA0}$ or $V_{ERA1}$). Accordingly, GIDL occurs in the source-side select transistor(s) STS, and electron-hole pairs are generated. In addition, the electrons move toward the source line SL, and the holes move toward the memory cell MC.

In the first erase voltage supply operation, as illustrated in FIGS. 9 and 10, the second voltage $V_2$ is supplied to the plurality of word lines WL and increases from the second reference voltage level (ground voltage $V_{SS}$) to the second erase voltage level ($V_{ERA0}$ or $V_{ERA1}$). In this first embodiment, the second erase voltage level is the same voltage as the first erase voltage level applied to the bit line BL and source line SL.

Thus, in this first embodiment, the second voltage $V_2$ supplied to the word lines WL is raised to the same voltage level ($V_{ERA0}$ or $V_{ERA1}$) as the first voltage $V_1$ at the same timings t101 to t102 (or t107 to t108) as supplied to the bit lines BL and the source lines SL. In this context, the voltage difference between the first reference voltage level ($V_{SRC}$) and the second reference voltage level ($V_{SS}$) is small, and the voltage difference between the first erase voltage level and the second erase voltage level is zero. Therefore, in the first erase voltage supply operation, the voltage difference between the channel of the semiconductor pillar 120 and the plurality of word lines WL (gate electrodes of the plurality of memory cells MC) is small, and the movement of the holes between the channel and the charge storage film 132 (FIG. 6) does not occur.

In step S202B, the second erase voltage supply operation is executed. The second erase voltage supply operation is an operation of maintaining the first voltage $V_1$ supplied to the bit line BL and the source line SL at the first erase voltage level ($V_{ERA0}$ or $V_{ERA1}$) while decreasing the second voltage $V_2$ supplied to the word line WL from the second erase voltage level ($V_{ERA0}$ or $V_{ERA1}$) to a first level voltage $V_{S1}$ to reduce the threshold voltages of the plurality of memory cells MC. In the example of FIG. 9, the operation is executed in a period from the timing t102 to the timing t103 and a period from the timing t108 to the timing t109.

In FIG. 9, at the timings t102 to t104 and the timings t108 to t110, the solid lines illustrate the waveform of the second voltage $V_2$ being applied to the word line WL. The dark dotted lines indicate the waveform corresponding to the first voltage $V_1$ being applied to the bit line BL and the source line SL though superimposed on the waveform of the second voltage $V_2$.

In the second erase voltage supply operation, the voltages supplied to the bit line BL, the source line SL, the drain-side select gate line SGD, and the source-side select gate line SGS are kept the same as in the first erase voltage supply operation. That is, the first erase voltage level ($V_{ERA0}$ or $V_{ERA1}$) is still supplied to the bit line BL and the source line SL. The voltage $V_{SG}'$ is supplied to the drain-side select gate line(s) SGD. The voltage $V_{SG}''$ is supplied to the source-side select gate line(s) SGS.

In the second erase voltage supply operation, as illustrated in FIG. 9, the second voltage $V_2$ supplied to the word line WL is gradually decreased from the second erase voltage level ($V_{ERA0}$ or $V_{ERA1}$) to the first level voltage $V_{S1}$. Therefore, the voltage difference between the channel of the semiconductor pillar 120 and the plurality of word lines WL (gate electrodes of the memory cells MC) is gradually increased. Accordingly, the holes in the channel of the semiconductor pillar 120 gradually tunnel into the charge storage film 132 (FIG. 6) through the tunnel insulating film 131 (FIG. 6). Accordingly, the threshold voltages of the plurality of memory cells MC are reduced.

After that, at the timings t103 to t104 or t109 to t110, the second voltage $V_2$ is decreased from the first level voltage $V_{S1}$ to the second reference voltage level (ground voltage $V_{SS}$).

In this first embodiment, in the second erase voltage supply operation, the time (t102 to t103 and t108 to t109 in FIG. 9) for decreasing the second voltage $V_2$ from the second erase voltage level ($V_{ERA0}$ or $V_{ERA1}$) to the first level voltage $V_{S1}$ is longer than the time (t101 to t102 and t107 to t108 in FIG. 9) for raising the second voltage $V_2$ from the second reference voltage level ($V_{SS}$) to the second erase voltage level ($V_{ERA0}$ or $V_{ERA1}$). That is, the second voltage $V_2$ is sharply raised from the second reference voltage level ($V_{SS}$) to the second erase voltage level ($V_{ERA0}$ or $V_{ERA1}$), but is relatively slowly reduced from the second erase voltage level ($V_{ERA0}$ or $V_{ERA1}$) to the first level voltage $V_{S1}$. Accordingly, the number of holes passing through the tunnel insulating film 131 (FIG. 6) per unit time is reduced.

In this embodiment, in the second erase voltage supply operation, the decrease in the second voltage $V_2$ per unit time (the rate of decrease) from the second erase voltage level ($V_{ERA0}$ or $V_{ERA1}$) to the second reference voltage level ($V_{SS}$) is constant or substantially constant. That is, the second voltage $V_2$ is linearly decreased from the second erase voltage level ($V_{ERA0}$ or $V_{ERA1}$) to the second reference voltage level ($V_{SS}$).

It is noted that, in the example of FIG. 9, in the second erase voltage supply operation (that is, the periods of the timings t102 to t103 or t108 to t109 in FIG. 9), the second voltage $V_2$ is decreased from the second erase voltage level ($V_{ERA0}$ or $V_{ERA1}$) to the first level voltage $V_{S1}$. However, the second voltage $V_2$ may instead be decreased from the second erase voltage level ($V_{ERA0}$ or $V_{ERA1}$) to the second reference voltage level (ground voltage $V_{SS}$) in these periods. In the example of FIG. 9, the operation at the timings t102 to t103 and t108 to t109 is considered to be the second erase voltage supply operation. However, the operation at the timings t102 to t104 and t108 to t110 may instead be considered to be the second erase voltage supply operation.

In step 203, an erase verify operation is executed. The erase verify operation is an operation of supplying the erase verify voltage $V_{VFYEr}$ to the word lines WL, detecting the ON state/OFF state of the memory cells MC, and detecting whether a threshold voltage of the memory cells MC has reached a target value. For example, this operation is executed during the period from the timing t105 to the timing t106 and the period from the timing t11 to the timing t112.

In the erase verify operation, as illustrated in FIG. 11, a voltage $V_{DD}$ is supplied to the bit line BL. The voltage $V_{SRC}$ is supplied to the source line SL. The voltage $V_{DD}$ is larger than the voltage $V_{SRC}$. In FIG. 9, the voltage applied to the source line SL is indicated by a solid line, and the voltage applied to the bit line BL is indicated by a dark dotted line.

In the erase verify operation, as illustrated in FIG. 11, the voltage $V_{SG}$ is supplied to the drain-side select gate line (s) SGD. The voltage $V_{SG}$ is larger than the voltage $V_{DD}$. In addition, the voltage difference between the voltage $V_{SG}$ and the voltage $V_{DD}$ is larger than the threshold voltage of the drain-side select transistor(s) STD. Therefore, an electron channel is formed in the channel region of the drain-side select transistor STD, and the voltage $V_{DD}$ is transferred.

In the erase verify operation, the voltage $V_{SG}$ is supplied to the source-side select gate line SGS. The voltage $V_{SG}$ is larger than the voltage $V_{SRC}$. The voltage difference between the voltage $V_{SG}$ and the voltage $V_{SRC}$ is larger than the threshold voltage of the source-side select transistor STS. Therefore, an electron channel is formed in the channel region of the source-side select transistor STS, and the voltage $V_{SRC}$ is transferred.

In the erase verify operation, the erase verify voltage $V_{VFYEr}$ (see FIG. 7A) is supplied to a word line WL. The erase verify voltage $V_{VFYEr}$ is, for example, about 1.0 V. Accordingly, as illustrated in FIG. 11, the memory cells MC for which threshold voltage is equal to or lower than the erase verify voltage $V_{VFYEr}$ are turned ON, and the memory cells MC for which threshold voltage is higher than the erase verify voltage $V_{VFYEr}$ are turned OFF. The ON state/OFF state of these memory cells MC is detected by the sense amplifier module SAM (FIG. 4) via the bit line BL, and the data indicating the ON state/OFF state of this memory cell MC is acquired. Such an operation is referred to as a "sense operation".

In the sense operation, the sense node of the sense amplifier SA (FIG. 4) is electrically connected to a bit line BL for a certain period while the voltage $V_{DD}$ is supplied to the bit line BL. After the sense operation is executed, the charges on the wiring LBUS are discharged or maintained according to the state of the sense node. Any one of the latch circuits in the sense amplifier unit SAU can be electrically connected to the wiring LBUS, and the data on the wiring LBUS latched by the latch circuit.

The data indicating the ON state/OFF state of the memory cell MC is transferred to a counter, a counter circuit, or the like via the wiring LBUS, the switch transistor DSW, and the wiring DBUS (FIG. 4).

In step S204, the result (pass/fail) of the erase verify operation is determined. For example, when the number of memory cells MC for which threshold voltage has not reached the target value is equal to or larger than a certain number, as determined by referring to the counter circuit, a verify FAIL is determined, and the process proceeds to step S205. If the number of memory cells MC for which threshold voltages has not reached the target value is equal to or less than a certain number, a verify PASS is determined, and the process proceeds to step S207.

In step S205, it is determined whether or not the number $n_E$ (loop variable) has reached a predetermined number $N_E$. When the number $n_E$ has not yet reached the predetermined number $N_E$, the process proceeds to step S206. When the number $n_E$ has reached the predetermined number $N_E$, the process proceeds to step S208.

In step S206, 1 is added to the number $n_E$, and the process proceeds to step S202A. In step S206, a predetermined voltage $\Delta V_{ERA}$ can be added to the first erase voltage level and the second erase voltage level. Therefore, the first erase voltage level and the second erase voltage level are increased as the number $n_E$ (number of previous erase attempts) is increased.

In step S207, the status data $D_{ST}$ indicating that the erasing operation was completed normally is stored in the status register STR (FIG. 2), and the erasing operation ends. It is noted that the status data $D_{ST}$ can be output to the controller die CD (FIG. 1) by a status read operation.

In step S208, the status data $D_{ST}$ indicating that the erasing operation did not end normally (status is not good "NG") is stored in the status register STR (FIG. 2), and the erasing operation ends.

COMPARATIVE EXAMPLE

Erasing Operation

Next, an erasing operation of a semiconductor storage device according to a comparative example will be described.

Figure 12:
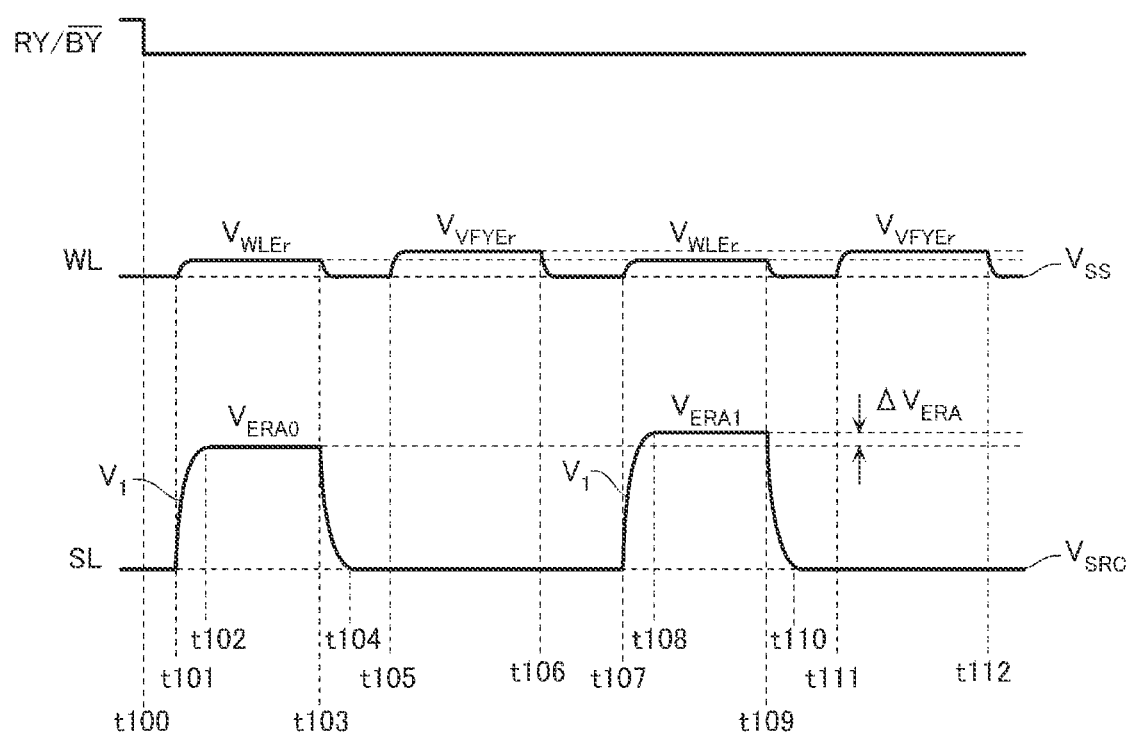
FIG. 12 is a timing chart illustrating an erasing operation of a comparative example.

FIG. 12 is a timing chart illustrating the erasing operation of the comparative example.

In the erasing operation of the comparative example, at the timing t101 or t107, a voltage $V_{WLEr}$ is supplied to the word lines WL. This voltage $V_{WLEr}$ is, for example, about 0.5 V. In some comparative examples, the voltage $V_{WLEr}$ may be the ground voltage $V_{SS}$ (0 V) or a voltage lower than the ground voltage $V_{SS}$. In the erasing operation of the comparative example, similar to the erasing operation of the first embodiment, at the timings t101 to t102 (or t107 to t108), the first voltage $V_1$ supplied to the bit line BL and the source line SL is increased from the first reference voltage level (voltage $V_{SRC}$) to the first erase voltage level $V_{ERA0}$ (or $V_{ERA1}$). Therefore, the voltage difference between the channel of the semiconductor pillar 120 and the plurality of word lines WL (which are the gate electrodes of the plurality of memory cells MC) is increased in a short period of time.

In the erasing operation of the comparative example, during the timings t102 to t103 (or t108 to t109), the voltage supplied to the word line WL is maintained at the voltage $V_{WLEr}$.

In the erasing operation of the comparative example, at the timings t103 to t104 (or t109 to t110), the voltage supplied to the word line WL is decreased from the voltage $V_{WLEr}$ to the second reference voltage level (ground voltage $V_{SS}$).

Thus, in the erasing operation of the comparative example, during the timings t101 to t102 (or t107 to t108), the voltage difference between the channel of the semiconductor pillar 120 and the plurality of word lines WL is increased in a short period of time. Accordingly, the voltage difference received by the tunnel insulating film 131 is sharply changed, and the number of holes passing through the tunnel insulating film 131 (FIG. 6) per unit time is relatively large. Therefore, there is a concern that the deterioration of the tunnel insulating film 131 may progress rapidly.

Effects

In the first erase voltage supply operation of the first embodiment, the second voltage $V_2$ supplied to the word line WL is raised to the same maximum voltage ($V_{ERA0}$ or $V_{ERA1}$) as the first voltage $V_1$ at the same timings t101 to t102 (or t107 to t108) supplied to the bit lines BL and the source lines SL. Accordingly, the voltage difference between the channel of the semiconductor pillar 120 and the plurality of word lines WL (gate electrodes of the plurality of memory cells MC) is reduced as compared to the comparative example during these periods, and the number of holes passing through the tunnel insulating film 131 (FIG. 6) per unit time is reduced as compared to the comparative example.

In the second erase voltage supply operation of the first embodiment, the time (t102 to t103 or t108 to t109 in FIG. 9) for decreasing the second voltage $V_2$ from the second erase voltage level ($V_{ERA0}$ or $V_{ERA1}$) to the first level voltage $V_{S1}$ is longer than the time (t101 to t102 and t107 to t108 in FIG. 9) required for raising the second voltage $V_2$ from the second reference voltage level ($V_{SS}$) to the second erase voltage level ($V_{ERA0}$ or $V_{ERA1}$). Accordingly, the number of holes passing through the tunnel insulating film 131 (FIG. 6) per unit time is reduced. Therefore, the deterioration of the tunnel insulating film 131 is reduced.

Second Embodiment

In the first embodiment, the same second voltage $V_2$ is supplied to each of the word lines WL in a memory block BLK that is a target of the erasing operation. In the second embodiment, different second voltages $V_2$ are supplied to word lines WL in a memory block BLK that is a target of the erasing operation.

Structure of Memory Cell Array Layer $L_{MCA}$

Figure 13:
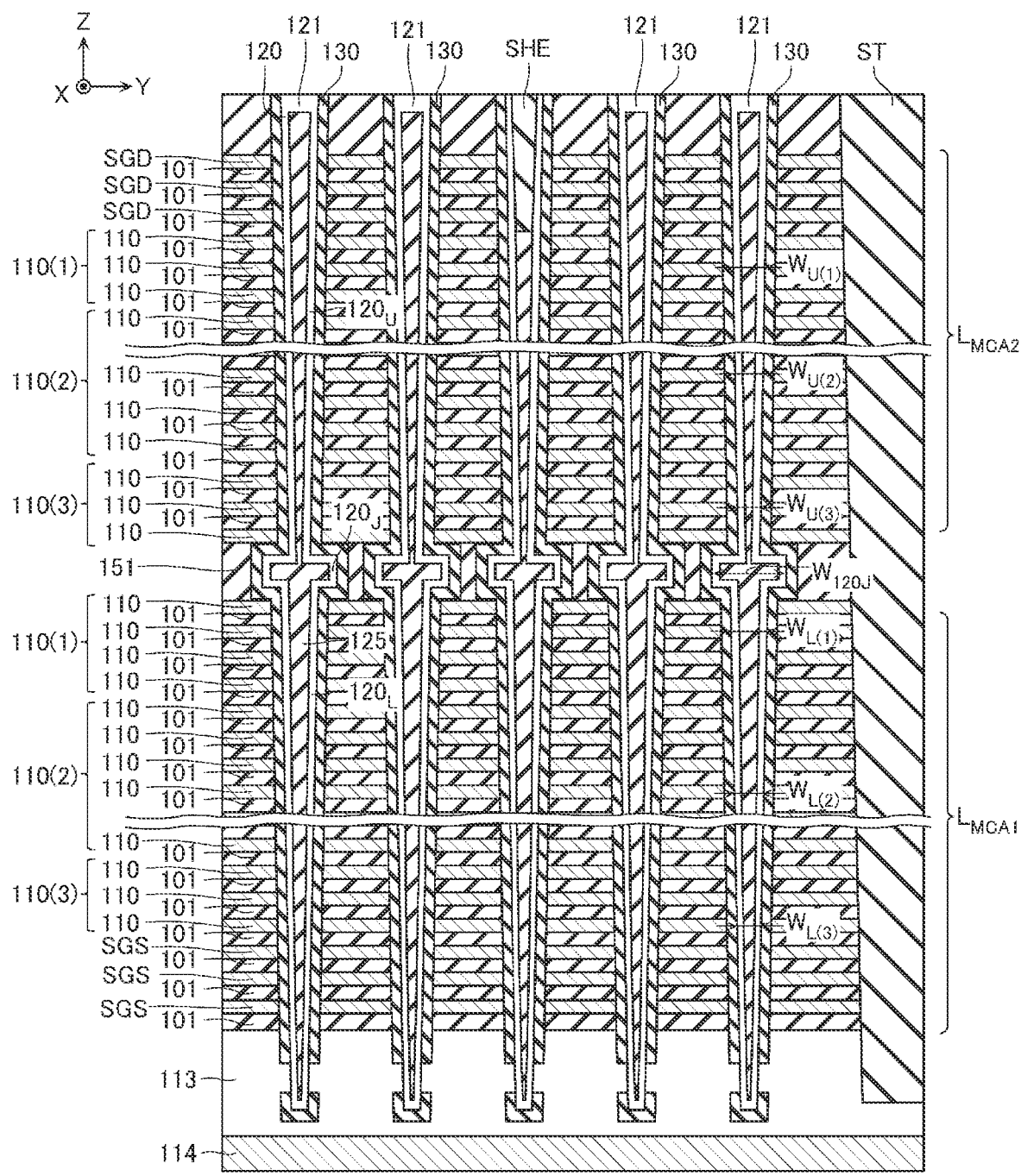
FIG. 13 is a schematic cross-sectional view illustrating a portion of a memory die according to a second embodiment.

FIG. 13 is a schematic cross-sectional view illustrating a configuration of a portion of the memory die MD according to the second embodiment. It is noted that components the same (or substantially so) as those already described with reference to FIGS. 5 and 6 are denoted by the same reference symbols and repeated descriptions may be omitted.

As illustrated in FIG. 13, the semiconductor storage device according to the second embodiment includes, instead of the memory cell array layer $L_{MCA}$ (FIG. 5), a memory cell array layer $L_{MCA1}$ and a memory cell array layer $L_{MCA2}$ provided above the memory cell array layer $L_{MCA1}$. The memory cell array layer $L_{MCA1}$ and the memory cell array layer $L_{MCA2}$ each include a plurality of conductive layers 110 arranged in the Z direction, a plurality of semiconductor pillars 120 extending in the Z direction, and a plurality of gate insulating films 130 that are provided between the conductive layers 110 and the semiconductor pillars 120. The insulating layers 101 of silicon oxide ($SiO_2$) or the like are provided between the plurality of conductive layers 110 arranged in the Z direction.

Among the plurality of conductive layers 110 provided in the memory cell array layer $L_{MCA1}$, one or more of the conductive layers 110 located at the lowest layer (s) functions as the source-side select gate line (s) SGS and gate electrode (s) of the source-side select transistor(s) STS connected thereto. The conductive layers 110 are electrically independent for each memory block BLK.

Among the plurality of conductive layers 110 provided in the memory cell array layer $L_{MCA1}$, a portion of the plurality of conductive layers 110 located above the conductive layer(s) 110 functioning as the source-side select gate line(s) SGS function as the word lines WL and the gate electrodes of the plurality of memory cells MC connected thereto. Each memory cell MC is provided between a conductive layer 110 and a semiconductor pillar 120. Each of the plurality of conductive layers 110 can be electrically independent within each memory block BLK.

A portion of the plurality of conductive layers 110 provided in the memory cell array layer $L_{MCA2}$ function as the word lines WL and the gate electrodes of the plurality of memory cells MC connected thereto. These conductive layers 110 can be electrically independent for each memory block BLK.

Among the plurality of conductive layers 110 provided in the memory cell array layer $L_{MCA2}$, one or more of conductive layers 110 located above the conductive layers functioning as the word lines WL function as the drain-side select gate line(s) SGD and the gate electrode(s) of the drain-side select transistor(s) STD connected thereto. These conductive layers 110 have somewhat smaller widths (dimensions) in the Y direction than the other conductive layers 110 in the memory cell array layer $L_{MCA2}$. An inter-string-unit insulating layer SHE is provided between conductive layers 110 in the Y direction. The conductive layers 110 are electrically independent for each string unit SU.

In the second embodiment, among the plurality of conductive layers 110 provided in the memory cell array layer $L_{MCA1}$, the conductive layers 110 functioning as the word lines WL can be considered as divided into a group of conductive layers 110(1) located above the other word lines WL, a group of conductive layers 110(2) located below the group of conductive layers 110(1), and a group of conductive layers 110(3) located below the group of conductive layers 110(2). Among the plurality of conductive layers 110 provided in the memory cell array layer $L_{MCA2}$, the conductive layers 110 functioning as the word lines WL can be considered divided into a group of conductive layers 110(1) located above the other word lines WL in the memory cell array layer $L_{MCA2}$, a group of conductive layers 110(2) located below the group of conductive layers 110(1), and a group of conductive layers 110(3) located below the group of conductive layers 110(2).

The semiconductor pillars 120 are arranged in a predetermined pattern in the X direction and the Y direction. The semiconductor pillars 120 function as channel regions of the plurality of memory cells MC and the select transistors (STD the STS) provided in each memory string MS. The semiconductor pillar 120 has a substantially cylindrical shape with a bottom, and the insulating film 125 of silicon oxide or the like is provided at the central portion.

As illustrated in FIG. 13, the semiconductor pillar 120 includes a semiconductor region $120_L$ provided in the memory cell array layer $L_{MCA1}$ and a semiconductor region $120_U$ provided in the memory cell array layer $L_{MCA2}$. The semiconductor pillar 120 also includes a semiconductor region $120_J$ connected to the upper end of the semiconductor region $120_L$ and the lower end of the semiconductor region $120_U$.

The semiconductor region $120_L$ is a substantially cylindrical region extending in the Z direction. Each of the outer peripheral surfaces of the semiconductor region $120_L$ is surrounded by the plurality of conductive layers 110 provided in the memory cell array layer $L_{MCA1}$ and faces the plurality of conductive layers 110.

The semiconductor region $120_U$ is a substantially cylindrical region extending in the Z direction. Each of the outer peripheral surfaces of the semiconductor region $120_U$ is surrounded by the plurality of conductive layers 110 provided in the memory cell array layer $L_{MCA2}$ and faces these plurality of conductive layers 110.

The semiconductor region $120_J$ is provided above the memory cell array layer $L_{MCA1}$ and below the memory cell array layer $L_{MCA2}$.

Radial Dimension of Semiconductor Regions $120_L$, $120_U$, $120_J$

Next, the dimensions of the semiconductor regions $120_L$, $120_U$, and $120_J$ in the radial direction will be described. In FIG. 13 and the like, the dimension along the Y direction of each of the semiconductor regions $120_L$, $120_U$, and $120_J$ may be referred to as a width in the radial direction, a pillar diameter, or the like.

The width of the semiconductor region $120_L$ in the radial direction becomes smaller along the downward direction of the semiconductor pillar 120. For example, the width $W_{L(3)}$ of the semiconductor region $120_L$ in the radial direction facing one conductive layer 110(3) among the plurality of conductive layers 110(3) is less than the width $W_{L(2)}$ of the semiconductor region $120_L$ in the radial direction facing one conductive layer 110(2) among the plurality of conductive layers 110(2). The width $W_{L(2)}$ of the semiconductor region $120_L$ is less than the width $W_{L(1)}$ of the semiconductor region $120_L$ in the radial direction facing one conductive layer 110(1) among the plurality of conductive layers 110(1).

Similarly, the width of the semiconductor region $120_U$ in the radial direction becomes smaller along the downward direction of the semiconductor pillar 120. For example, the width $W_{U(3)}$ of the semiconductor region $120_U$ in the radial direction facing one conductive layer 110(3) among the plurality of conductive layers 110(3) is less than the width $W_{U(2)}$ of the semiconductor region $120_U$ in the radial direction facing one conductive layer 110(2) among the plurality of conductive layers 110(2). The width $W_{U(2)}$ is less than the width Wu(i) of the semiconductor region $120_U$ in the radial direction facing one conductive layer 110(1) among the plurality of conductive layers 110(1). It is noted that in this example the width $W_{U(3)}$ is less than the width $W_{L(1)}$.

The width $W_{120J}$ of the semiconductor region $120_J$ in the radial direction is greater than a maximum width of the semiconductor region $120_L$ in the radial direction as well as a maximum width of the semiconductor region $120_U$ in the radial direction.

Erasing Operation

Next, an erasing operation of the semiconductor storage device according to the second embodiment will be described.

Figure 14:
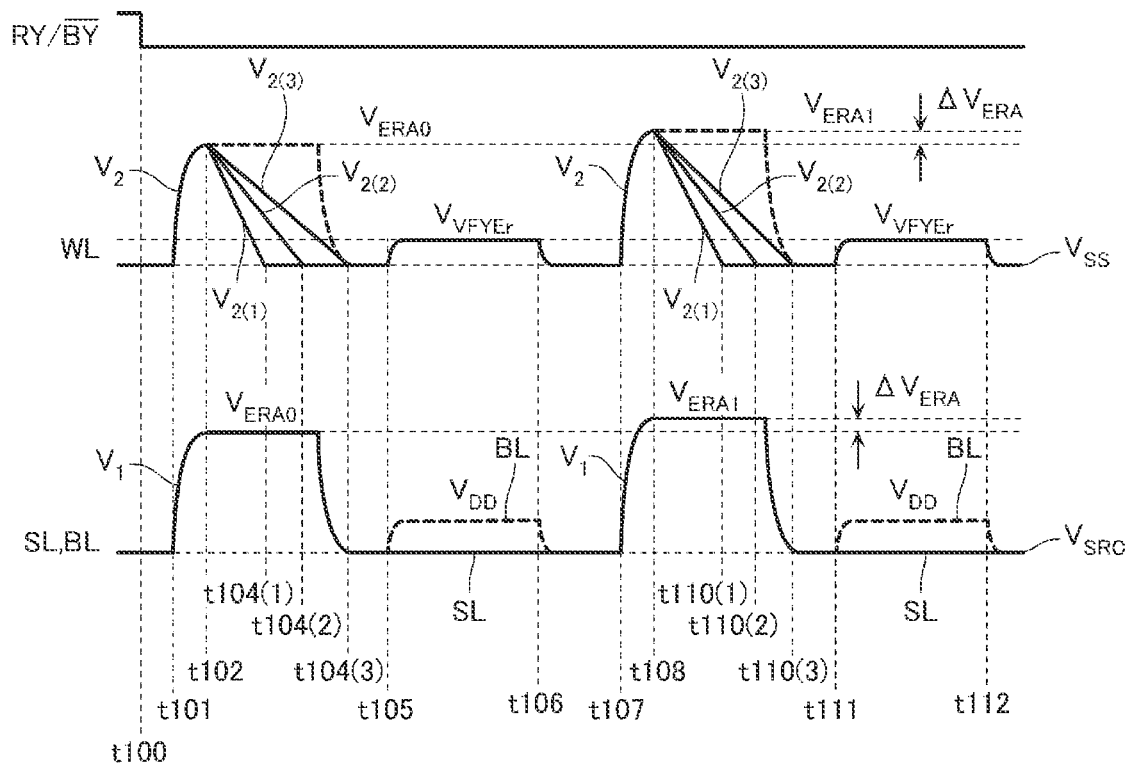
FIG. 14 is a timing chart illustrating an erasing operation of a second embodiment.

FIG. 14 is a timing chart illustrating the erasing operation of the second embodiment. As illustrated in FIG. 14, the erasing operation of the second embodiment is basically the same operation as the erasing operation of the first embodiment (see FIG. 9). However, the second voltage $V_2$ supplied to the word lines WL in the second erase voltage supply operation (during the timings t102 to t104 and t108 to t110) is somewhat different from the first embodiment.

For the conductive layers 110(1) in FIG. 13, the second voltage $V_{2(1)}$ supplied to these conductive layers 110(1) is decreased from the second erase voltage level ($V_{ERA0}$ or $V_{ERA1}$) to the second reference voltage level (ground voltage $V_{SS}$) in the period of the timings t102 to t104(1) or t108 to t110(1). In the case of the conductive layers 110(2) in FIG. 13, the second voltage $V_{2(2)}$ supplied to these conductive layers 110(2) is decreased from the second erase voltage level ($V_{ERA0}$ or $V_{ERA1}$) to the second reference voltage level (ground voltage $V_{SS}$) in the period of the timings t102 to t104(2) or t108 to t110(2) in FIG. 14. In the case of the conductive layers 110(3) in FIG. 13, the second voltage $V_{2(3)}$ supplied to these conductive layers 110(3) is decreased from the second erase voltage level ($V_{ERA0}$ or $V_{ERA1}$) to the second reference voltage level (ground voltage $V_{SS}$) in the period of the timings t102 to t104(3) or t108 to t110(3).

As illustrated in FIG. 14, the timings t104(1) and t110(1) are earlier than the timings t104(2) and t110(2), respectively. The timings t104(2) and t110(2) are earlier than the timings t104(3) and t110(3), respectively.

As illustrated in FIG. 14, in the second erase voltage supply operation, the decrease in the second voltage $V_2$ per unit time from the second erase voltage level to the second reference voltage level is constant or substantially constant. That is, the second voltage $V_2$ is linearly decreased from the second erase voltage level to the second reference voltage level.

The voltage generation circuit VG generates the plurality of different second voltages $V_2$ ($V_{2(1)}$, $V_{2(2)}$, $V_{2(3)}$) applied to the word lines WL (conductive layers 110(1), 110(2), and 110(3)) according to the control signal from the sequencer SQC during the second erase voltage supply operation of the second embodiment and outputs this plurality of second voltages $V_2$ to the plurality of voltage supply lines 31. A second voltage $V_2$ output from the voltage supply line 31 may be appropriately adjusted according to the control signal from the sequencer SQC.

In the second erase voltage supply operation of the second embodiment, the decrease in the second voltage $V_2$ per unit time is changed according to the width (dimension) of the semiconductor pillar 120 in the radial direction. For the word lines WL at the positions where the semiconductor pillar 120 has a large width (for example, adjacent the conductive layers 110(1)) in the radial direction, the electric field generated according to the voltage difference between the channel and the gate electrode is weaker than for the word lines WL at the positions where the semiconductor pillar 120 has a smaller width (for example, adjacent the conductive layers 110(2)) in the radial direction, and the threshold voltage of the memory cell MC is less likely to be reduced. For the word lines WL (for example, the conductive layer 110(3)) at the position where the width of the semiconductor pillar 120 in the radial direction is even smaller, the electric field generated according to the voltage difference between the channel and the gate electrode is strong, and the threshold voltage of the memory cell MC is more likely to be reduced.

Therefore, in the second erase voltage supply operation of the second embodiment, for the word lines WL (for example, the conductive layers 110(1)) at the position where the width of the semiconductor pillar 120 in the radial direction is large, the decrease in the second voltage $V_2$ per unit time is allowed to be large (fast), so that the reduction of the threshold voltage of the memory cell MC can progress rapidly. Conversely, for the word lines WL (for example, the conductive layers 110(3)) at the position where the width of the semiconductor pillar 120 in the radial direction is smallest, the decrease in the second voltage $V_2$ per unit time can be small (slower) so that the reduction of the threshold voltage of the memory cell MC can progress slowly. Accordingly, the erasing operation can be appropriately performed according to the positions of the word lines WL along the Z direction of the semiconductor pillars 120.

Third Embodiment

In the second embodiment, a method of decreasing the second voltage $V_2$ supplied to the word line WL changes according to the position of the word line WL in the Z direction. In a third embodiment, the peak value of the second voltage ($V_{12}$ in FIG. 15 and $V_{22}$ in FIG. 16) supplied to the word lines WL is changed according to the position of the word line WL in the Z direction.

The semiconductor storage device according to the third embodiment has a structure including the memory cell array layer $L_{MCA1}$ and the memory cell array layer $L_{MCA2}$ such as illustrated in FIG. 13.

Figure 15:
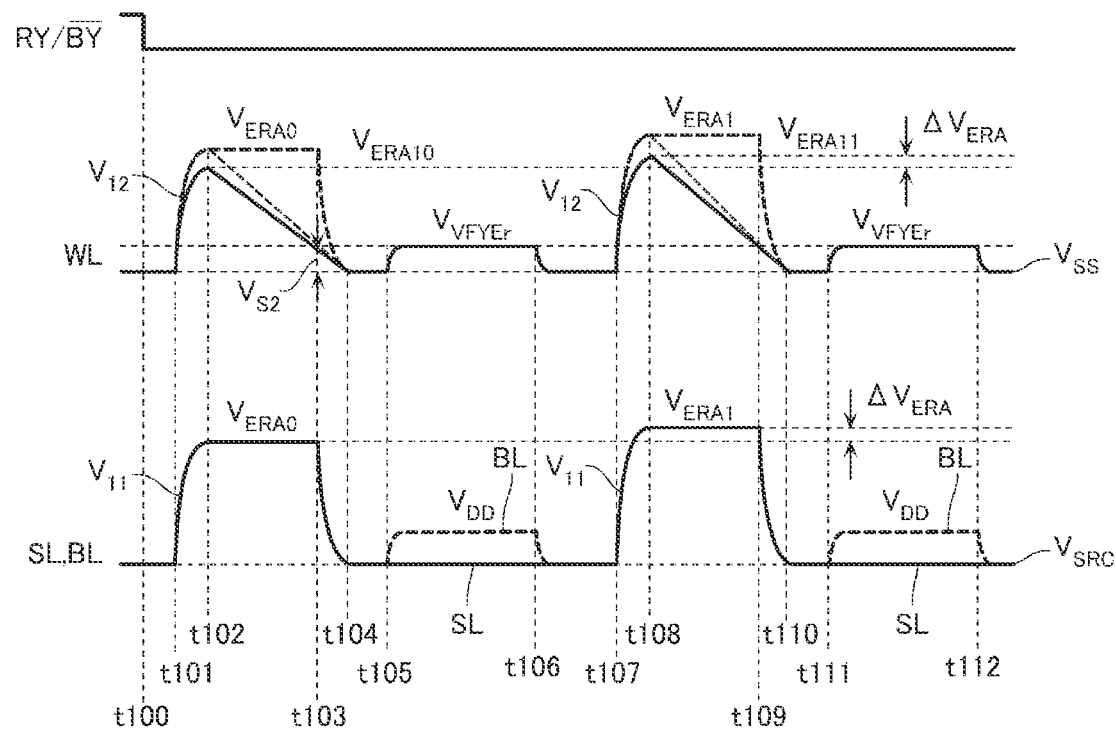
FIG. 15 is a timing chart illustrating an erasing operation of a third embodiment.

FIG. 15 is a timing chart illustrating the erasing operation of the third embodiment. The erasing operation of the third embodiment (FIG. 15) is basically the same operation as the erasing operation of the second embodiment (FIG. 14). However, in FIG. 15, the peak values ($V_{ERA10}$ and $V_{ERA11}$) of the second voltage $V_{12}$ can be smaller than the peak values ($V_{ERA0}$ and $V_{ERA1}$) of the first voltage $V_{11}$.

It is noted that, at the timings t102 to t104 and the timings t108 to t110, the solid lines indicate the waveform of the second voltage $V_{12}$ applied to a word line WL (for example, the conductive layer 110(1) in FIG. 13). The dark dotted lines indicate the waveform of the same voltage as the first voltage $V_{11}$ applied to the bit line BL and the source line SL, and the waveform of the second voltage $V_{2(3)}$ in FIG. 14 (as applied to the conductive layer 110(2) in FIG. 13) are superimposed on the waveform of the second voltage $V_{12}$.

In the first erase voltage supply operation (periods of timings t101 to t102 or t107 to t108 in FIG. 15) of the third embodiment, the first voltage $V_1$ supplied to the bit line BL and the source line SL is increased from the first reference voltage level (voltage $V_{SRC}$ in FIG. 15) to the first erase voltage level ($V_{ERA0}$ or $V_{ERA1}$) and the second voltage $V_{12}$ supplied to the word line WL is increased from the second reference voltage level (ground voltage $V_{SS}$ in FIG. 15) to the second erase voltage level ($V_{ERA10}$ or $V_{ERA11}$).

In this context, the second erase voltage level ($V_{ERA10}$ or $V_{ERA11}$) is lower than the first erase voltage level ($V_{ERA0}$ or $V_{ERA1}$).

In the second erase voltage supply operation (periods of timings t102 to t103 or t108 to t109 in FIG. 15) of the third embodiment, the first voltage $V_{11}$ supplied to the bit line BL and the source line SL is maintained at the first erase voltage level ($V_{ERA0}$ or $V_{ERA1}$), and the second voltage $V_{12}$ supplied to the word line WL is decreased from the second erase voltage level ($V_{ERA0}$ or $V_{ERA11}$) to a second level voltage $V_{S2}$ so that the threshold voltages of the plurality of memory cells MC are reduced.

After that, at the timings t103 to t104 or t109 to t110, the second voltage $V_{12}$ is decreased from the second level voltage $V_{S2}$ to the second reference voltage level (ground voltage $V_{SS}$).

In the second erase voltage supply operation of the third embodiment, the decrease in the second voltage $V_{12}$ per unit time from the second erase voltage level $V_{ERA10}$ or $V_{ERA11}$ to the second reference voltage level ($V_{SS}$) is constant or substantially constant (linear).

Figure 16:
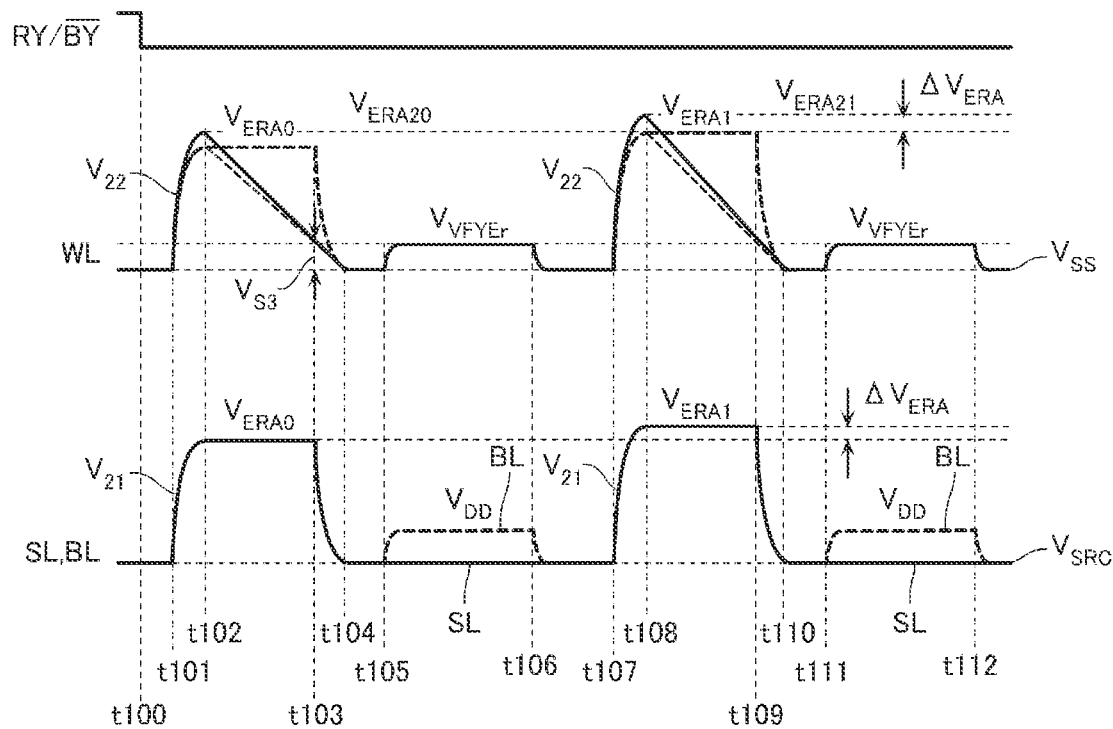
FIG. 16 is a timing chart illustrating another erasing operation of a third embodiment.

FIG. 16 is a timing chart illustrating another erasing operation of the third embodiment. The erasing operation of the third embodiment (FIG. 16) is basically the same operation as the erasing operation of the first embodiment (FIG. 14). However, as depicted in FIG. 16, the peak values ($V_{ERA20}$ and $V_{ERA21}$) of the second voltage $V_{22}$ are larger than the peak values ($V_{ERA0}$ and $V_{ERA1}$) of the first voltage $V_{21}$.

It is noted that, at the timings t102 to t104 and the timings t108 to t110, the solid lines indicate the waveform of the second voltage $V_{22}$ applied to the word line WL (for example, the conductive layer 110(3) in FIG. 13). The dark dotted lines indicate the waveform of the same voltage as the first voltage $V_{21}$ applied to the bit line BL and the source line SL and the waveform of the second voltage $V_{2(3)}$ in FIG. 14 (as applied to the conductive layer 110(2) in FIG. 13) are superimposed on the waveform of the second voltage $V_{22}$.

In the first erase voltage supply operation (the periods of timings t101 to t102 or t107 to t108 in FIG. 16) of the third embodiment, the first voltage $V_{21}$ supplied to the bit line BL and the source line SL is increased from the first reference voltage level (voltage $V_{SRC}$ in FIG. 16) to the first erase voltage level ($V_{ERA0}$ or $V_{ERA1}$), and the second voltage $V_{22}$ supplied to the word line WL is increased from the second reference voltage level (ground voltage $V_{SS}$ in FIG. 16) to the second erase voltage level ($V_{ERA20}$ or $V_{ERA21}$).

In this context, the second erase voltage level $V_{ERA20}$ (or $V_{ERA21}$) is a voltage higher than the first erase voltage level $V_{ERA0}$ (or $V_{ERA1}$).

In the second erase voltage supply operation (the periods of timings t102 to t103 or t108 to t109 in FIG. 16) of the third embodiment, the first voltage $V_{21}$ supplied to the bit line BL and the source line SL is maintained at the first erase voltage level $V_{ERA0}$ (or $V_{ERA1}$) and the second voltage $V_{22}$ supplied to the word line WL is decreased from the second erase voltage level $V_{ERA20}$ (or $V_{ERA21}$) to a third level voltage $V_{S3}$, so that the threshold voltages of the plurality of memory cells MC are reduced.

After that, at the timings t103 to t104 or t109 to t110, the second voltage $V_{22}$ is decreased from the third level voltage $V_{S3}$ to the second reference voltage level (ground voltage $V_{SS}$).

In the second erase voltage supply operation of the third embodiment, the decrease in the second voltage $V_{22}$ per unit time from the second erase voltage level $V_{ERA20}$ (or $V_{ERA21}$) to the second reference voltage level ($V_{SS}$) is constant or substantially constant (linear).

In the first erase voltage supply operation and the second erase voltage supply operation of the third embodiment, the peak values of the second voltages $V_{12}$ and $V_{22}$ can be changed according to the width of the semiconductor pillar 120 in the radial direction. As described with second embodiment, for the word line WL (for example, in the conductive layer 110(1)) at the position where the width of the semiconductor pillar 120 in the radial direction is large, the threshold voltage of the memory cell MC is less likely to be reduced. For the word line WL (for example, the conductive layer 110(3)) at the position where the width of the semiconductor pillar 120 in the radial direction is small, the threshold voltage of the memory cell MC is likely to be reduced.

Therefore, in the first erase voltage supply operation and the second erase voltage supply operation of the third embodiment, for the word lines WL (for example, the conductive layer 110(1)) at the position where the width of the semiconductor pillar 120 in the radial direction is large, the peak value of the second voltage $V_{12}$ can be small to strongly perform the operation of reducing the threshold voltage of the memory cell MC as indicated in FIG. 15. For the word line WL (for example, the conductive layer 110(3)) at the position where the width of the semiconductor pillar 120 in the radial direction is small, the peak value of the second voltage $V_{22}$ can be large to more weakly perform the operation of reducing the threshold voltage of the memory cell MC as indicated in FIG. 16. Accordingly, the erasing operation can be appropriately performed according to the position of the word lines WL in the Z direction.

Fourth Embodiment

In the second embodiment, the method of decreasing the second voltage $V_2$ supplied to the word line WL is changed according to the position of the word line WL in the Z direction. In the fourth embodiment, the timing for raising the second voltage ($V_{32}$ in FIG. 17 and $V_{42}$ in FIG. 18) is changed according to the capacitance of the word lines WL or the time constant (capacitance×resistance) value.

The semiconductor storage device according to the fourth embodiment has a structure including the memory cell array layer $L_{MCA1}$ and the memory cell array layer $L_{MCA2}$ such as illustrated in FIG. 13.

Figure 17:
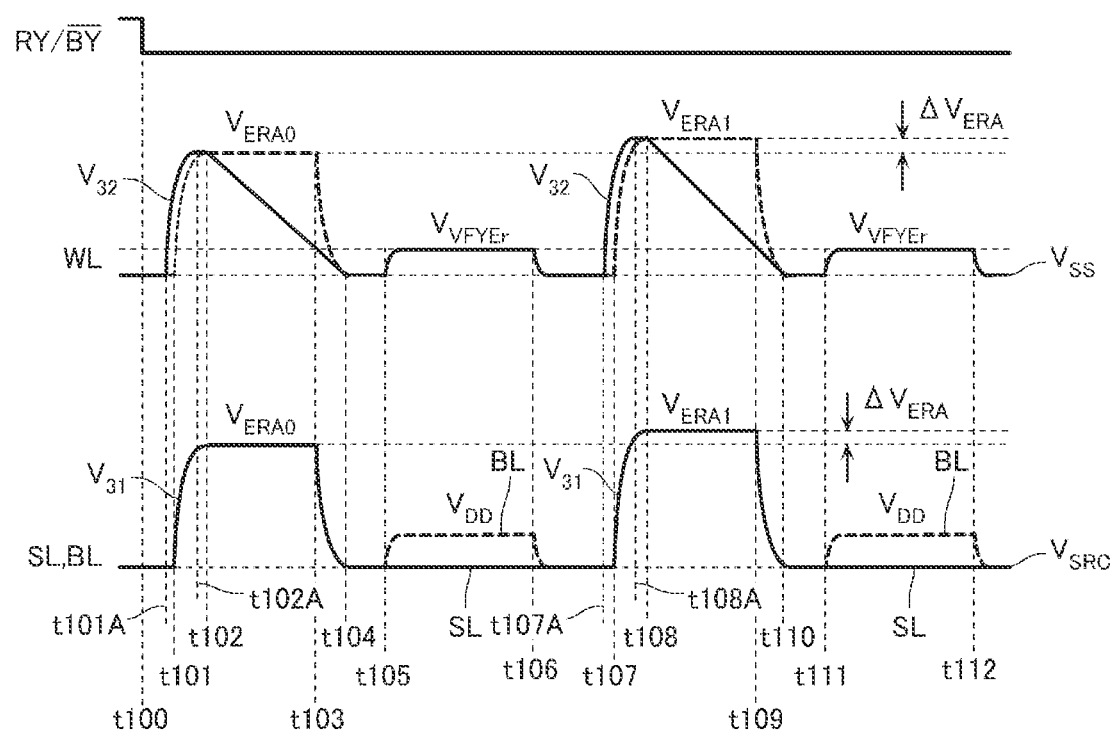
FIG. 17 is a timing chart illustrating an erasing operation of a fourth embodiment.

FIG. 17 is a timing chart illustrating the erasing operation of the fourth embodiment. The erasing operation of the fourth embodiment (FIG. 17) is basically the same operation as the erasing operation of the second embodiment (FIG. 14). However, in FIG. 17, the second voltage $V_{32}$ begins to be raised at a timing somewhat earlier than that of a first voltage $V_{31}$.

It is noted that, at the timings t101 (t101A) to t102 (t102A) and the timings t107 (t107A) to t108 (t108A), the solid lines indicate the waveform of the second voltage $V_{32}$ applied to the word line WL. The dark dotted lines indicate the waveform of the same voltage as the first voltage $V_{31}$ applied to the bit line BL and the source line SL superimposed on the waveform of the second voltage $V_{32}$.

At the timings t101 to t102 (or t107 to t108) in the first erase voltage supply operation of the fourth embodiment, the first voltage $V_{31}$ supplied to the bit line BL and the source line SL is increased from the first reference voltage level ($V_{SRC}$) to the first erase voltage level ($V_{ERA0}$ or $V_{ERA1}$). At the timings t101A to t102A (or t107A to t108A) in the first erase voltage supply operation of the fourth embodiment, the second voltage $V_{32}$ supplied to the word line WL is increased from the second reference voltage level ($V_{SS}$) to the second erase voltage level ($V_{ERA0}$ or $V_{ERA1}$).

In this context, the timings t101A and t102A are slightly earlier than the timings t101 and t102.

Figure 18:
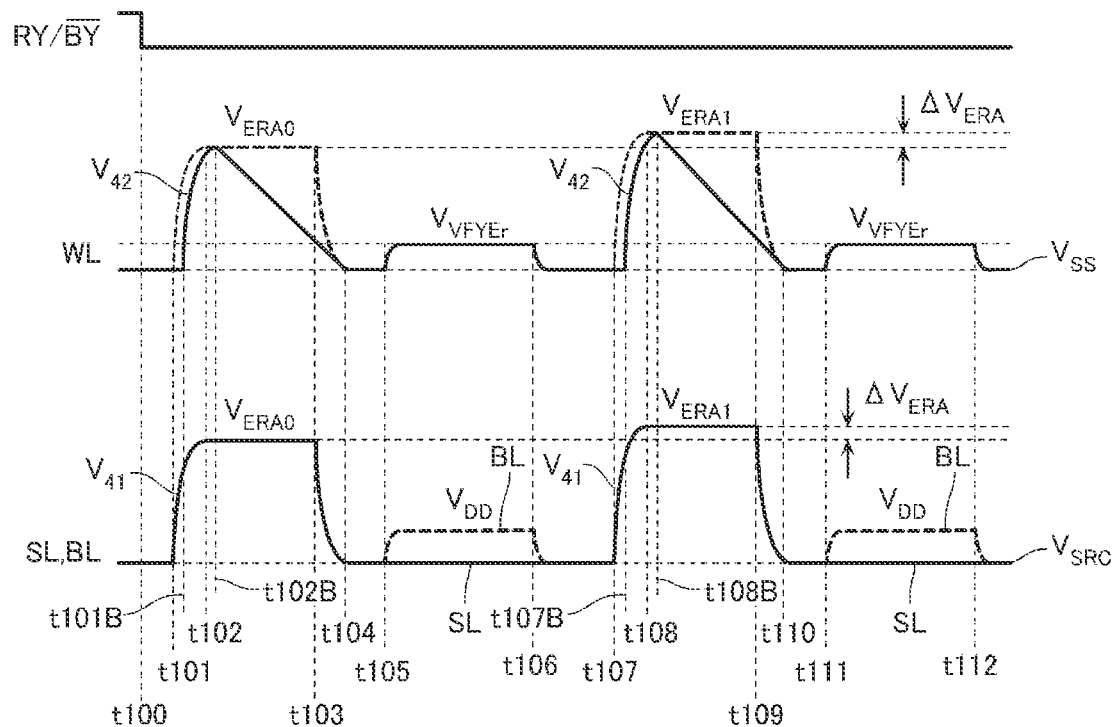
FIG. 18 is a timing chart illustrating another erasing operation of a fourth embodiment.

FIG. 18 is a timing chart illustrating another erasing operation of the fourth embodiment. The erasing operation of the fourth embodiment (FIG. 18) is basically the same operation as the erasing operation of the second embodiment (FIG. 14). However, in FIG. 18, the second voltage $V_{42}$ begins to be raised at a timing somewhat later than that of a first voltage $V_{41}$.

It is noted that, at the timings t101 (t101B) to t102 (t102B) and the timings t107 (t107B) to t108 (t108B), the solid lines indicate the waveform of the second voltage $V_{42}$ applied to the word line WL. The dark dotted lines indicate the waveform of the same voltage as the first voltage $V_{41}$ applied to the bit line BL and the source line SL superimposed on the waveform of the second voltage $V_{42}$.

At the timings t101 to t102 (or t107 to t108) in the first erase voltage supply operation of the fourth embodiment, the first voltage $V_{41}$ supplied to the bit line BL and the source line SL is increased from the first reference voltage level ($V_{SRC}$) to the first erase voltage level ($V_{ERA0}$ or $V_{ERA1}$). At the timings t101B to t102B (or t107B to t108B) in the first erase voltage supply operation of the fourth embodiment, the second voltage $V_{42}$ supplied to the word line WL is increased from the second reference voltage level ($V_{SS}$) to the second erase voltage level ($V_{ERA0}$ or $V_{ERA1}$)

In this context, the timings t101B and t102B are slightly later than the timings t101 and t102.

In the first erase voltage supply operation of the fourth embodiment, the timing of the raising of the second voltages $V_{32}$ and $V_{42}$ is changed according to the capacitance or the time constant (capacitance×resistance) value of the different word lines WL. The plurality of word lines WL (conductive layers 110) have different capacitances and resistances according to position or the like (for example, the width of the semiconductor pillars 120 in the radial direction facing the word lines WL varies) in the Z direction. When a word line WL has a large capacitance or a large time constant (capacitance×resistance), the raising of the second voltage for that word line WL can be relatively late. Therefore, as illustrated in FIG. 17, the second voltage $V_{32}$ is supplied at a timing earlier than that of the first voltage $V_{31}$ for a word line WL having a large capacitance or a larger time constant (capacitance×resistance). If the capacitance or time constant (capacitance×resistance) of a word line WL is small, the raising of the second voltage for that word line WL can be relatively fast. Therefore, as illustrated in FIG. 18, the second voltage $V_{42}$ is supplied to the word line WL having a small capacitance or a small time constant (capacitance× resistance) at a timing later than the first voltage $V_{41}$. Accordingly, the erasing operation can be appropriately performed according to the capacitance or the time constant of the word line WL.

Fifth Embodiment

In the second embodiment, the method of decreasing the second voltage $V_2$ supplied to the word line WL is changed according to the position of the word lines WL in the Z direction. In the fifth embodiment, the decrease of the second voltage ($V_{52}$ in FIG. 19, and $V_{62}$ in FIG. 20) per unit time is changed according to the position of the word lines WL in the Z direction.

The semiconductor storage device according to the fifth embodiment has a structure including a memory cell array layer $L_{MCA1}$ and the memory cell array layer $L_{MCA2}$ such as illustrated in FIG. 13.

Figure 19:
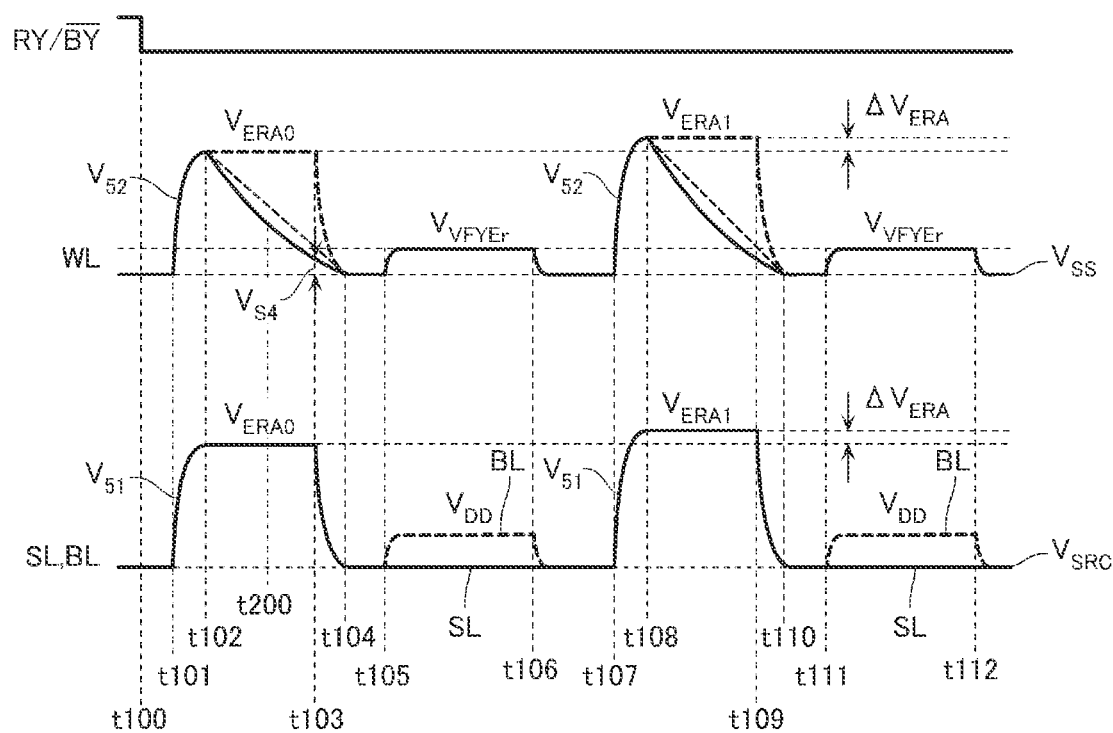
FIG. 19 is a timing chart illustrating an erasing operation of a fifth embodiment.

FIG. 19 is a timing chart illustrating the erasing operation of the fifth embodiment. The erasing operation of the fifth embodiment (FIG. 19) is basically the same operation as the erasing operation of the second embodiment (FIG. 14). However, as depicted in FIG. 19, the decrease in the second voltage $V_{52}$ per unit time (the rate of decrease) is varied from a large amount to a small amount.

It is noted that, at the timings t102 to t104 and the timings t108 to t110, the solid lines indicate the waveform of the second voltage $V_{52}$ applied to the word line WL (for example, the conductive layer 110(1) in FIG. 13). The dark dotted lines indicate the waveform of the same voltage as the first voltage $V_{51}$ applied to the bit line BL and the source line SL, and the waveform of the second voltage $V_2(3)$ in FIG. 14 (as applied to the conductive layer 110(2) in FIG. 13) superimposed on the waveform of the second voltage $V_{52}$.

In the second erase voltage supply operation (timings t102 to t103 or t108 to t109 in FIG. 19) of the fifth embodiment, the first voltage $V_{S1}$ supplied to the bit line BL and the source line SL is maintained at the first erase voltage level ($V_{ERA0}$ or $V_{ERA1}$), and the second voltage $V_{52}$ supplied to the word line WL is decreased from the second erase voltage level ($V_{ERA0}$ or $V_{ERA1}$) to the fourth level voltage $V_{S4}$, so that the threshold voltages of the plurality of memory cells MC are reduced.

In this context, the period from the timing t102 to t103 in FIG. 19 includes the first half period (t102 to t200) and the second half period (t200 to t103). In the first half period (t102 to t200), the amount of decrease in the second voltage $V_{52}$ per unit time for a word line WL (conductive layer 110(1) in FIG. 13) is larger than the amount of decrease in the second voltage (the dotted line in FIG. 19) per unit time for to another word line WL (the conductive layer 110(2) in FIG. 13). In the second half period (t200 to t103), the amount of decrease in the second voltage $V_{52}$ per unit time for the word line WL (the conductive layer 110(1) in FIG. 13) is smaller than the amount of decrease in the second voltage (the dotted line in FIG. 19) per unit time for the other word line WL (the first conductive layer 110(2) in FIG. 13).

After that, at the timings t103 to t104 or t109 to t110, the second voltage $V_{52}$ is decreased from the fourth level voltage $V_{S4}$ to the second reference voltage level (ground voltage $V_{SS}$).

Figure 20:
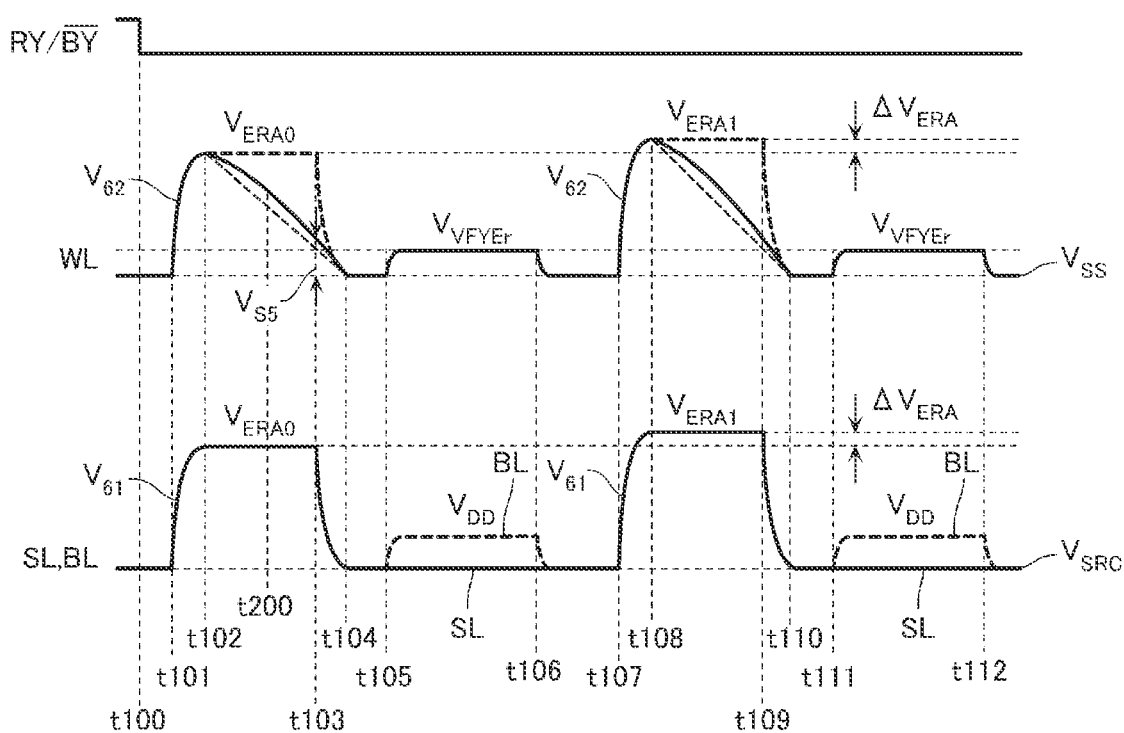
FIG. 20 is a timing chart illustrating another erasing operation of a fifth embodiment.

FIG. 20 is a timing chart illustrating another erasing operation of the fifth embodiment. The erasing operation of the fifth embodiment (FIG. 20) is basically the same operation as the erasing operation of the second embodiment (FIG. 14). However, as depicted in FIG. 20, the amount of decrease in the second voltage $V_{62}$ per unit time changes from a small amount to a large amount.

It is noted that, at the timings t102 to t104 and the timings t108 to t110, the solid lines indicate the waveform of the second voltage $V_{62}$ applied to the word line WL (for example, the conductive layer 110(3) in FIG. 13). The dark dotted lines indicate the waveform of the same voltage as the first voltage $V_{61}$ applied to the bit line BL and the source line SL and the waveform (waveform of the same voltage as the second voltage $V_2(3)$ in FIG. 14) of the second voltage applied to the word line WL (for example, the conductive layer 110(2) in FIG. 13) superimposed on the waveform of the second voltage $V_{62}$.

In the second erase voltage supply operation (timings t102 to t103 or t108 to t109 in FIG. 20) of the fifth embodiment, the first voltage $V_{61}$ supplied to the bit line BL and the source line SL is maintained at the first erase voltage level ($V_{ERA0}$ or $V_{ERA1}$) and the second voltage $V_{62}$ supplied to the word line WL is decreased from the second erase voltage level ($V_{ERA0}$ or $V_{ERA1}$) to the fifth level voltage $V_{SS}$, so that the threshold voltages of the plurality of memory cells MC are reduced.

In this context, the period from the timing t102 to t103 in FIG. 20 includes the first half period (t102 to t200) and the second half period (t200 to t103). In the first half period (t102 to t200), the amount of decrease in the second voltage $V_{62}$ per unit time for a word line WL (the conductive layer 110(1) in FIG. 13) is smaller than the amount of decrease in the second voltage (the dotted line in FIG. 19) per unit time for another word line WL (first conductive layer 110(2) in FIG. 13). In the second half period (t200 to t103), the amount of decrease in the second voltage $V_{62}$ per unit time for the word line WL (the conductive layer 110(1) in FIG. 13) is larger than the amount of decrease in the second voltage (the dotted line in FIG. 19) per unit time for the other word line WL (first conductive layer 110(2) in FIG. 13).

After that, at the timings t103 to t104 or t109 to t110, the second voltage $V_{62}$ is decreased from the fifth level voltage $V_{S5}$ to the second reference voltage (ground voltage $V_{SS}$).

In the second erase voltage supply operation of the fifth embodiment, the amounts of decrease in the second voltages $V_{52}$ and $V_{62}$ per unit time can be changed according to the width of the semiconductor pillar 120 in the radial direction. As described for second embodiment, the threshold voltage of the memory cell MC is less likely to be reduced in the word lines WL (for example, the conductive layer 110(1)) at a position where the width of the semiconductor pillar 120 in the radial direction is large. However, for the word lines WL (for example, the conductive layer 110(3)) at the position where the width of the semiconductor pillar 120 in the radial direction is small, the threshold voltage of the memory cell MC is likely to be reduced.

Therefore, in the second erase voltage supply operation of the fifth embodiment, for the word line WL (for example, the conductive layer 110(1)) at the position where the width of the semiconductor pillar 120 in the radial direction is large, in the first half period (t102 to t200) the amount of decrease in the second voltage $V_{62}$ per unit time can be large, as illustrated in FIG. 19, so that the operation of reducing the threshold voltage of the memory cell MC is strongly executed. For the word line WL (for example, the conductive layer 110(3)) at the position where the width of the semiconductor pillar 120 in the radial direction is small, in the first half period (t102 to t200) the amount of decrease in the second voltage $V_{62}$ per unit time is can be small, as illustrated in FIG. 20, so that the operation of reducing the threshold voltage of the memory cell MC is weakly executed. Accordingly, the erasing operation can be appropriately performed according to the position of the word line WL in the Z direction.

The voltages $V_{2(1)}$ and $V_{2(2)}$ in FIG. 14, $V_{12}$ in FIG. 15, $V_{22}$ in FIG. 16, $V_{32}$ in FIG. 17, $V_{42}$ in FIG. 18, $V_{52}$ in FIG. 19, and $V_{62}$ in FIG. 20 in the second to fifth embodiments described above may each be referred to as a "third voltage".

OTHER EMBODIMENTS

The semiconductor storage devices according to certain example embodiment were described above. However, these examples are non-limiting, and the described example configurations, methods, and the like may be adjusted in various aspects without departing from the scope of the present disclosure.

For example, when performing the first erase voltage supply operation and the second erase voltage supply operation in the first to fifth embodiments, an example of supplying a first erase voltage level) to both the bit line BL and the source line SL was illustrated. However, in other examples, when performing the first erase voltage supply operation and the second erase voltage supply operation, the supply of the first erase voltage level to one of the bit line BL or the source line SL may be omitted.

In the second erase voltage supply operation in the first to fifth embodiments, the GIDL is generated in the drain-side select transistor STD and the source-side select transistor STS, so that the holes can be supplied to the channel of the semiconductor pillar 120. However, in other examples, a P-type well of the semiconductor substrate 100 or other P-type semiconductor region may be connected to the semiconductor pillar 120, and the holes may be supplied to the semiconductor pillar 120 through this well or region.

In this case, for the second erase voltage supply operation, a voltage (for example, $V_{SG(A)}$) can be supplied to the drain-side select gate line SGD. The voltage $V_{SG(A)}$ has a magnitude such that the drain-side select transistor STD is turned off. In the second erase voltage supply operation, a voltage (for example, $V_{SG(B)}$) can be supplied to the source-side select gate line SGS. The voltage $V_{SG(B)}$ can be smaller than the first erase voltage level ($V_{ERA0}$ or $V_{ERA1}$). The voltage difference between the voltage $V_{SG(B)}$ and the erase voltage $V_{ERA0}$ (or $V_{ERA1}$) can be greater than the threshold voltage when the source-side select transistor STS functions as a PMOS transistor. Therefore, a hole channel is formed in the channel region of the source-side select transistor STS, and the first erase voltage level ($V_{ERA0}$ or $V_{ERA1}$) is transferred.

In the erasing operation in the first to fifth embodiments, the verify operation for odd-numbered word lines WL (Odd) and the verify operation for even-numbered word lines WL (Even) may be executed separately. In this case, when the verify operation for the odd-numbered word line WL (Odd) is to be performed, the erase verify voltage $V_{VFYEr}$ is supplied to the odd-numbered word line WL (Odd), and the read pass voltage $V_{READ}$ is supplied to the even-numbered word line WL (Even). When the verify operation for the even-numbered word line WL (Even) is to be performed, the erase verify voltage $V_{VFYEr}$ is supplied to the even-numbered word line WL (Even), and the read pass voltage $V_{READ}$ is supplied to the odd-numbered word line WL (Odd).

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a plurality of conductive layers arranged in a first direction;
   a first semiconductor pillar extending in the first direction through the plurality of conductive layers;
   a charge storage layer between the first semiconductor pillar and the plurality of conductive layers;
   a first wiring connected to a first end of the first semiconductor pillar;
   a second wiring connected to a second end of the first semiconductor pillar; and
   a control circuit electrically connected to the plurality of conductive layers, the first wiring, and the second wiring, wherein
   the control circuit is configured to execute an erasing operation including:
      a first operation period in which a first voltage supplied to at least one of the first wiring and the second wiring is increased from a first reference voltage level to a first erase voltage level and a second voltage supplied to a first conductive layer in the plurality of conductive layers is increased from a second reference voltage level to a second erase voltage level; and
      a second operation period after the first operation period in which the first voltage is maintained at the first erase voltage level and the second voltage is decreased from the second erase voltage level to the second reference voltage level or a first level voltage which is larger than the second reference voltage level.

2. The semiconductor storage device according to claim 1, wherein, when a difference between the first reference voltage level and the second reference voltage level is a first voltage difference, a difference between the first erase voltage level and the second erase voltage level is a second voltage difference, a difference between the first reference voltage level and the first erase voltage level is a third voltage difference, and a difference between the second reference voltage level and the second erase voltage level is a fourth voltage difference, the third voltage difference is larger than each of the first voltage difference and the second voltage difference, and the fourth voltage difference is also larger than each of the first voltage difference and the second voltage difference.

3. The semiconductor storage device according to claim 1, wherein a time for decreasing the second voltage from the second erase voltage level to one of the second reference voltage level or the first level voltage is longer than a time for increasing the second voltage from the second reference voltage level to the second erase voltage level.

4. The semiconductor storage device according to claim 1, wherein
   the control circuit is further configured to:
      increase a third voltage supplied to a second conductive layer in the plurality of conductive layers from the second reference voltage level to the second erase voltage level in the first operation period; and
      decrease the third voltage from the second erase voltage level to the second reference voltage level in the second operation period, and
   a time required for decreasing the second voltage from the second erase voltage level to the second reference voltage level is shorter than a time required for decreasing the third voltage from the second erase voltage level to the second reference voltage level.

5. The semiconductor storage device according to claim 4, wherein
   a width of the first semiconductor pillar in a radial direction intersecting the first direction varies according to a position in the first direction, and
   the width of a portion of the first semiconductor pillar adjacent the first conductive layer is larger than the width of a portion of the first semiconductor pillar adjacent the second conductive layer.

6. The semiconductor storage device according to claim 1, wherein, in the second operation period, the rate of decrease in the second voltage from the second erase voltage level to the second reference voltage level or the first level voltage is constant or substantially constant.

7. The semiconductor storage device according to claim 1, wherein
   the second erase voltage level is equal to the first erase voltage level, and
   the control circuit is further configured to:
      increase a third voltage supplied to a second conductive layer of the plurality of conductive layers from the second reference voltage level to a third erase voltage level which is lower than the second erase voltage level during the first operation period; and
      decrease the third voltage from the third erase voltage level to the second reference voltage level or a second level voltage, which is higher than the second reference voltage level, in the second operation period.

8. The semiconductor storage device according to claim 7, wherein
   the second erase voltage level is equal to the first erase voltage level,
   a width of the first semiconductor pillar in a radial direction intersecting the first direction varies according to a position in the first direction, and
   the width of a portion of the first semiconductor pillar adjacent the first conductive layer is smaller than the width of the portion of the first semiconductor pillar adjacent the second conductive layer.

9. The semiconductor storage device according to claim 1, wherein the control circuit is further configured to:

increase a third voltage supplied to a second conductive layer of the plurality of conductive layers from the second reference voltage level to a third erase voltage level, which is higher than the second erase voltage level during the first operation period; and decrease the third voltage from the third erase voltage level to the second reference voltage level or a third level voltage, which is higher than the second reference voltage level during the second operation period.

10. The semiconductor storage device according to claim 9, wherein
a width of the first semiconductor pillar in a radial direction intersecting the first direction varies according to a position in the first direction, and
the width of a portion of the first semiconductor pillar adjacent the first conductive layer is larger than the width of a portion of the first semiconductor pillar adjacent the second conductive layer.

11. The semiconductor storage device according to claim 1, wherein
the control circuit is further configured to:
increase a third voltage supplied to a second conductive layer in the plurality of conductive layers from the second reference voltage level to the second erase voltage level in the first operation period, and
a timing for starting the increase of the third voltage in the first operation period is earlier than a timing for starting the increase of the second voltage in the first operation period.

12. The semiconductor storage device according to claim 11, wherein a capacitance of the second conductive layer larger than a capacitance of the first conductive layer.

13. The semiconductor storage device according to claim 1, wherein
the control circuit is further configured to:
increase a third voltage supplied to a second conductive layer of the plurality of conductive layers from the second reference voltage level to the second erase voltage level during the first operation period, and
a timing for starting the increase of the third voltage in the first operation is later than a timing for starting the increase of the second voltage in the first operation period.

14. The semiconductor storage device according to claim 13, wherein a capacitance of the second conductive layer is smaller than a capacitance of the first conductive layer.

15. The semiconductor storage device according to claim 1, wherein the second operation period includes a first period and a second period after the first period,
the control circuit is further configured to:
increase a third voltage supplied to a second conductive layer of the plurality of conductive layers from the second reference voltage level to the second erase voltage level in the first operation period; and
decrease the third voltage from the second erase voltage level to the second reference voltage level or a fourth level voltage higher than the second reference voltage level during the second operation period, and
in the first period of the second operation period, the rate of decrease in the third voltage is larger than the rate of decrease in the second voltage.

16. The semiconductor storage device according to claim 15, wherein
a width of the first semiconductor pillar in a radial direction intersecting the first direction varies according to a position in the first direction, and
the width of a portion of the first semiconductor pillar adjacent the first conductive layer is smaller than the width of a portion of the first semiconductor pillar adjacent the second conductive layer.

17. The semiconductor storage device according to claim 1, wherein
the second operation period includes a first period and a second period after the first period,
the control circuit is further configured to:
increase a third voltage supplied to a second conductive layer of the plurality of conductive layers from the second reference voltage level to the second erase voltage level in the first operation period; and
decrease the third voltage from the second erase voltage level to the second reference voltage level or a fifth level voltage higher than the second reference voltage level during the second operation period, and
in the first period of the second operation period, the rate of decrease in the third voltage is less than the rate of decrease in the second voltage.

18. The semiconductor storage device according to claim 17, wherein
a width of the first semiconductor pillar in a radial direction intersecting the first direction varies according to a position in the first direction, and
the width of a portion of the first semiconductor pillar adjacent the first conductive layer is larger than the width of a portion of the first semiconductor pillar adjacent the second conductive layer.

* * * * *